US012652045B2

(12) United States Patent
Watanabe et al.

(10) Patent No.: US 12,652,045 B2
(45) Date of Patent: Jun. 9, 2026

(54) SEMICONDUCTOR DEVICE, SEMICONDUCTOR SYSTEM, AND METHOD OF CONTROLLING SEMICONDUCTOR DEVICE

(71) Applicant: Kioxia Corporation, Tokyo (JP)

(72) Inventors: Fumiya Watanabe, Chigasaki Kanagawa (JP); Kazuhiko Satou, Yokohama Kanagawa (JP); Kenro Kubota, Fujisawa Kanagawa (JP); Atsuko Saeki, Yokohama Kanagawa (JP); Ryota Tsuchiya, Kamakura Kanagawa (JP); Harumi Abe, Kawasaki Kanagawa (JP); Kanta Nagumo, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 89 days.

(21) Appl. No.: 18/594,589

(22) Filed: Mar. 4, 2024

(65) Prior Publication Data

US 2024/0313776 A1 Sep. 19, 2024

(30) Foreign Application Priority Data

Mar. 16, 2023 (JP) ................................. 2023-042083

(51) Int. Cl.
*H03K 19/00* (2006.01)
*H03K 19/003* (2006.01)
*H03K 19/0185* (2006.01)

(52) U.S. Cl.
CPC ... *H03K 19/0005* (2013.01); *H03K 19/00384* (2013.01); *H03K 19/018557* (2013.01)

(58) Field of Classification Search
None
See application file for complete search history.

(56) References Cited

U.S. PATENT DOCUMENTS

| | | | | |
|---|---|---|---|---|
| 2008/0001623 A1* | 1/2008 | Kim | ................... | H03K 19/0005 326/30 |
| 2009/0256585 A1* | 10/2009 | Kwon | ................. | G11C 11/4097 326/30 |
| 2013/0113515 A1* | 5/2013 | Lee | ................ | H03K 19/018571 326/30 |
| 2018/0261260 A1 | 9/2018 | Hirashima et al. | | |

FOREIGN PATENT DOCUMENTS

| | | | | | |
|---|---|---|---|---|---|
| CN | 110060727 A | * | 7/2019 | ............. | G11C 29/50 |
| CN | 110070905 A | * | 7/2019 | ............. | G11C 29/50 |
| JP | 2018-152147 A | | 9/2018 | | |

* cited by examiner

*Primary Examiner* — Anh Q Tran
(74) *Attorney, Agent, or Firm* — Kim & Stewart LLP

(57) ABSTRACT

A semiconductor device includes a first circuit, a first pad, a first comparator, a second comparator, and a control circuit. The first circuit is configured to pull up a voltage of a first node, and includes a plurality of first transistors connected in parallel to the first node. The first pad is connected to the first node. The first comparator is configured to compare a voltage of the first node with a first reference voltage. The second comparator is configured to compare the voltage of the first node with a second reference voltage. The control circuit is configured to control the plurality of first transistors based on an output of the first comparator and an output of the second comparator.

19 Claims, 25 Drawing Sheets

FIG. 6

FROM SEQUENCER 13

VCCQL

33

330

331

TO SELECTOR 37

TO SELECTOR 35

VSS

FIG. 9

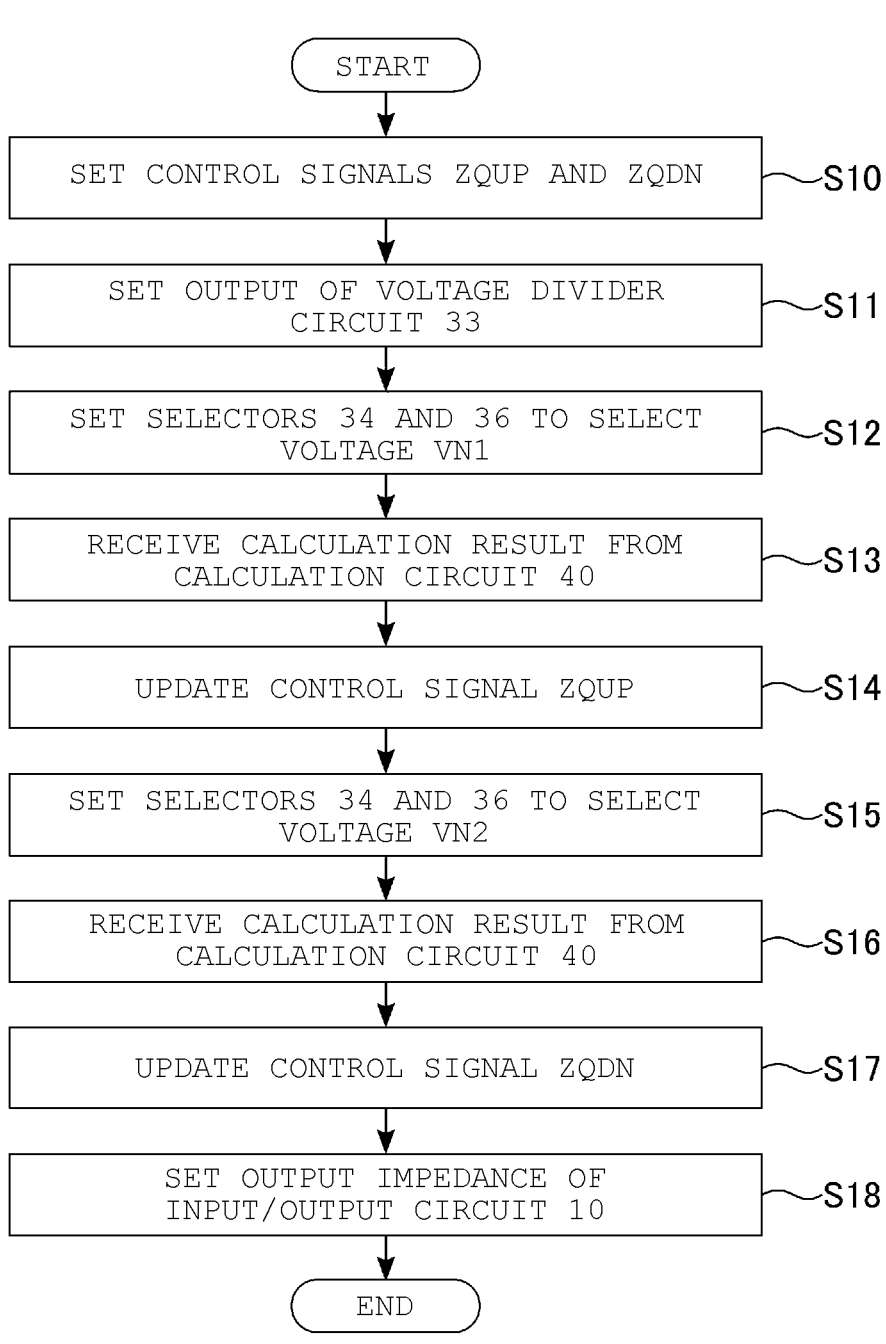

START

SET CONTROL SIGNALS ZQUP AND ZQDN  ~S10

SET OUTPUT OF VOLTAGE DIVIDER CIRCUIT 33  ~S11

SET SELECTORS 34 AND 36 TO SELECT VOLTAGE VN1  ~S12

RECEIVE CALCULATION RESULT FROM CALCULATION CIRCUIT 40  ~S13

UPDATE CONTROL SIGNAL ZQUP  ~S14

SET SELECTORS 34 AND 36 TO SELECT VOLTAGE VN2  ~S15

RECEIVE CALCULATION RESULT FROM CALCULATION CIRCUIT 40  ~S16

UPDATE CONTROL SIGNAL ZQDN  ~S17

SET OUTPUT IMPEDANCE OF INPUT/OUTPUT CIRCUIT 10  ~S18

END

| COMPARATOR 38 | COMPARATOR 39 | CALCULATION RESULT |
|:---:|:---:|:---:|
| H | H | HIGH |
| H | L | APPROPRIATE |
| L | L | LOW |
| L | H | ERROR |

| COMPARATOR 38 | COMPARATOR 39 | CALCULATION RESULT |
|---|---|---|
| H | H | CONSIDERABLY HIGH |
| H | L | SLIGHTLY HIGH |
| L | L | APPROPRIATE OR LOW |
| L | H | ERROR |

| COMPARATOR 38 | COMPARATOR 39 | CALCULATION RESULT |
|:---:|:---:|:---:|
| H | H | APPROPRIATE OR HIGH |
| H | L | SLIGHTLY LOW |
| L | L | CONSIDERABLY LOW |
| L | H | ERROR |

START

SET OUTPUT OF VOLTAGE DIVIDER CIRCUIT 33 TO MIDDLE DETECTION — S60

SET MIDDLE DETECTION IN CALCULATION CIRCUIT 40a — S61

RECEIVE CALCULATION RESULT FROM CALCULATION CIRCUIT 40a — S62

UPDATE CONTROL SIGNAL ZQUP — S63

END

*FIG. 30*

SEMICONDUCTOR DEVICE, SEMICONDUCTOR SYSTEM, AND METHOD OF CONTROLLING SEMICONDUCTOR DEVICE

CROSS-REFERENCE TO RELATED APPLICATION

This application is based upon and claims the benefit of priority from Japanese Patent Application No. 2023-042083, filed Mar. 16, 2023, the entire contents of which are incorporated herein by reference.

FIELD

Embodiments described herein relate generally to a semiconductor device, a semiconductor system, and a method of controlling the semiconductor device.

BACKGROUND

ZQ calibration circuits that calibrate output impedances of input/output circuits are known.

BRIEF DESCRIPTION OF THE DRAWINGS

FIG. 6 is a circuit diagram illustrating a configuration example of a pull-down circuit of the semiconductor device;

FIG. 9 is a flowchart illustrating an example of a short calibration operation performed by the semiconductor device;

FIG. 30 is a block diagram illustrating an example of a configuration of a semiconductor device according to a modified example.

DETAILED DESCRIPTION

Figure 1:
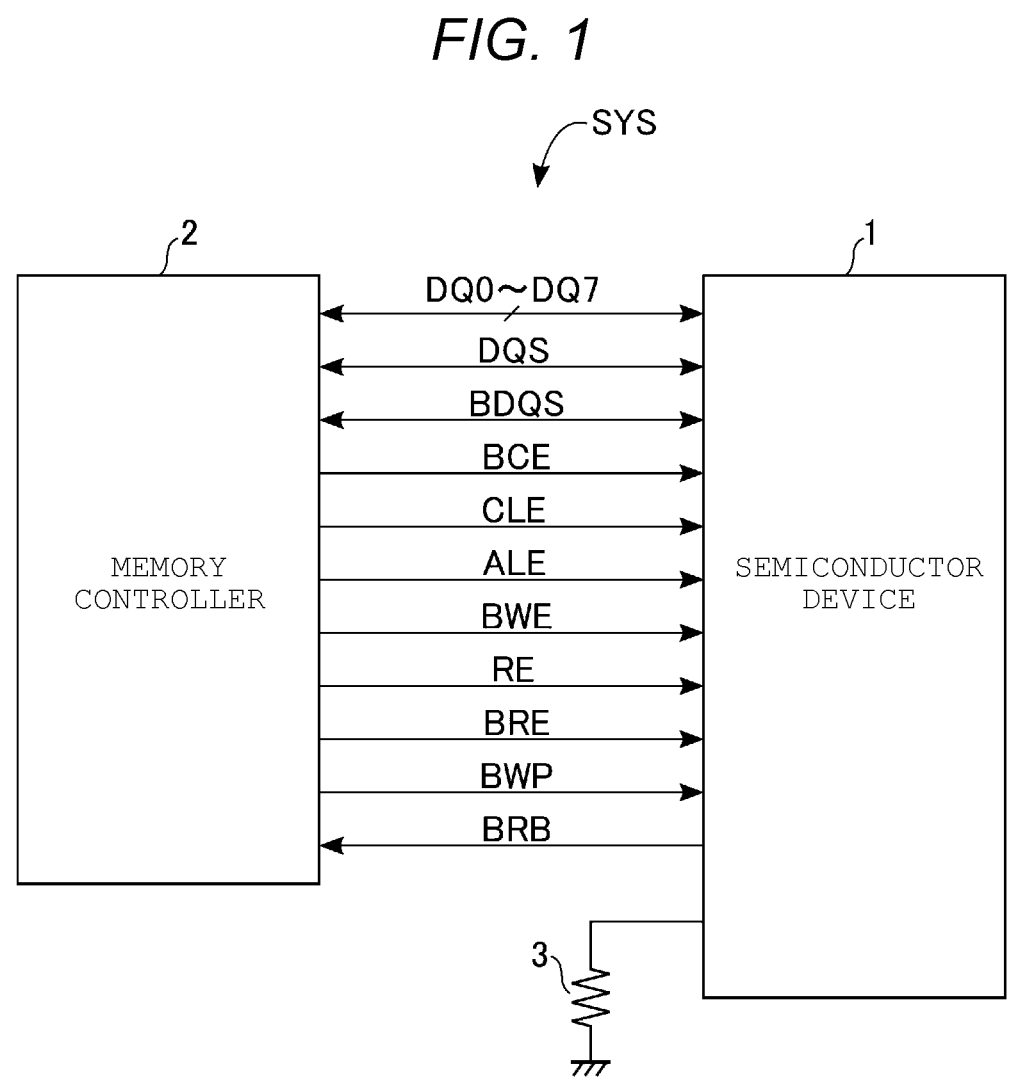
FIG. 1 is a block diagram illustrating an example of a configuration of a memory system including a semiconductor device according to a first embodiment.

Embodiments provide a semiconductor device, a semiconductor system, and a method of controlling the semiconductor device in which operation reliability is improved.

In general, according to an embodiment, a semiconductor device includes a first circuit, a first pad, a first comparator, a second comparator, and a control circuit. The first circuit is configured to pull up a voltage of a first node, and includes a plurality of first transistors connected in parallel to the first node. The first pad is connected to the first node. The first comparator is configured to compare a voltage of the first node with a first reference voltage. The second comparator is configured to compare the voltage of the first node with a second reference voltage. The control circuit is configured to control the plurality of first transistors based on an output of the first comparator and an output of the second comparator.

Hereinafter, embodiments will be described with reference to the drawings. In description, the same reference numerals are given to elements that have substantially the same functions and configurations. The embodiments to be described below are examples of technical ideas. In the embodiment, materials, shapes, structures, dispositions, and the like of the elements are not specified. The embodiments may be modified in various forms.

In the following description, an element X<n:0> means a set including elements X<0>, <1>, . . . , and X<n>.

<1> First Embodiment

A semiconductor device according to a first embodiment will be described.

<1-1> Configuration

<1-1-1> Overall Configuration of Semiconductor Device 1

FIG. 1 is a block diagram illustrating an example of a configuration of a memory system including the semiconductor device according to the first embodiment. A memory system SYS is a storage device. The memory system SYS executes a write operation, a read operation, and the like for data in response to a command from an external host device (not illustrated). As illustrated in FIG. 1, the memory system SYS includes a semiconductor device 1, a memory controller 2, and a resistance element 3.

The semiconductor device 1 is a nonvolatile memory. The semiconductor device 1 is, for example, a NAND flash memory.

The memory controller 2 is, for example, an integrated circuit such as a system-on-a-chip (SoC). The memory controller 2 controls the semiconductor device 1.

The resistance element 3 is a resistor. The resistance element 3 is used as a reference of a resistant value. One end of the resistance element 3 is connected to the semiconductor device 1 and the other end of the resistance element 3 is grounded.

The semiconductor device 1 and the memory controller 2 are connected to each other via, for example, a NAND bus. Communication via the NAND bus includes, for example, DQ0 to DQ7, DQS, BDQS, BCE, CLE, ALE, BWE, RE, BRE, BWP, and BRB.

The signals DQ0 to DQ7 are, for example, 8-bit signals. The signals DQ0 to DQ7 are data transmitted and received between the semiconductor device 1 and the memory controller 2. The signals DQ0 to DQ7 can include any of a command, an address, and data.

The signals DOS and BDQS are signals for controlling operation timings at which the signals DQ0 to DQ7 are transmitted and received. The signals DQS and BDQS are transmitted and received between the semiconductor device 1 and the memory controller 2.

The signal BCE is a signal for setting the semiconductor device 1 to a selection state or a non-selection state. The signal BCE is transmitted from the memory controller 2 to the semiconductor device 1.

The signal CLE is a signal for a notification indicating that the signals DQ0 to DQ7 are commands. The signal ALE is a signal for a notification indicating that the signals DQ0 to DQ7 are addresses. The signal BWE is a signal for instructing the semiconductor device 1 to receive the signals DQ0 and DQ7. The signals RE and BRE are signals for instructing the semiconductor device 1 to output the signals DQ0 and DQ7. The signals RE and BRE control an operation timing of the semiconductor device 1 when the semiconductor device 1 outputs the signals DQ0 to DQ7. The signal BWP is a signal for prohibiting the semiconductor device 1 from performing a write operation and an erasing operation. The signals CLE, ALE, BWE, RE, BRE, and BWP are each transmitted from the memory controller 2 to the semiconductor device 1.

The signal BRB is a signal indicating whether the semiconductor device 1 is in a ready state (a state in which a command can be received from the outside) or a busy state (a state in which a command cannot be received from the outside). The signal BRB is transmitted from the semiconductor device 1 to the memory controller 2.

In the present disclosure, a signal with a head sign "B" is a signal that is asserted at an "L" level. Specifically, the signals BDQS, BCE, BWE, BRE, BWP, and BRB are each asserted at the "L" level. The signal BDQS is an inverted signal of the signal DOS. The signal BRE is an inverted signal of the signal RE.

<1-1-2> Configuration of Semiconductor Device 1

Figure 2:
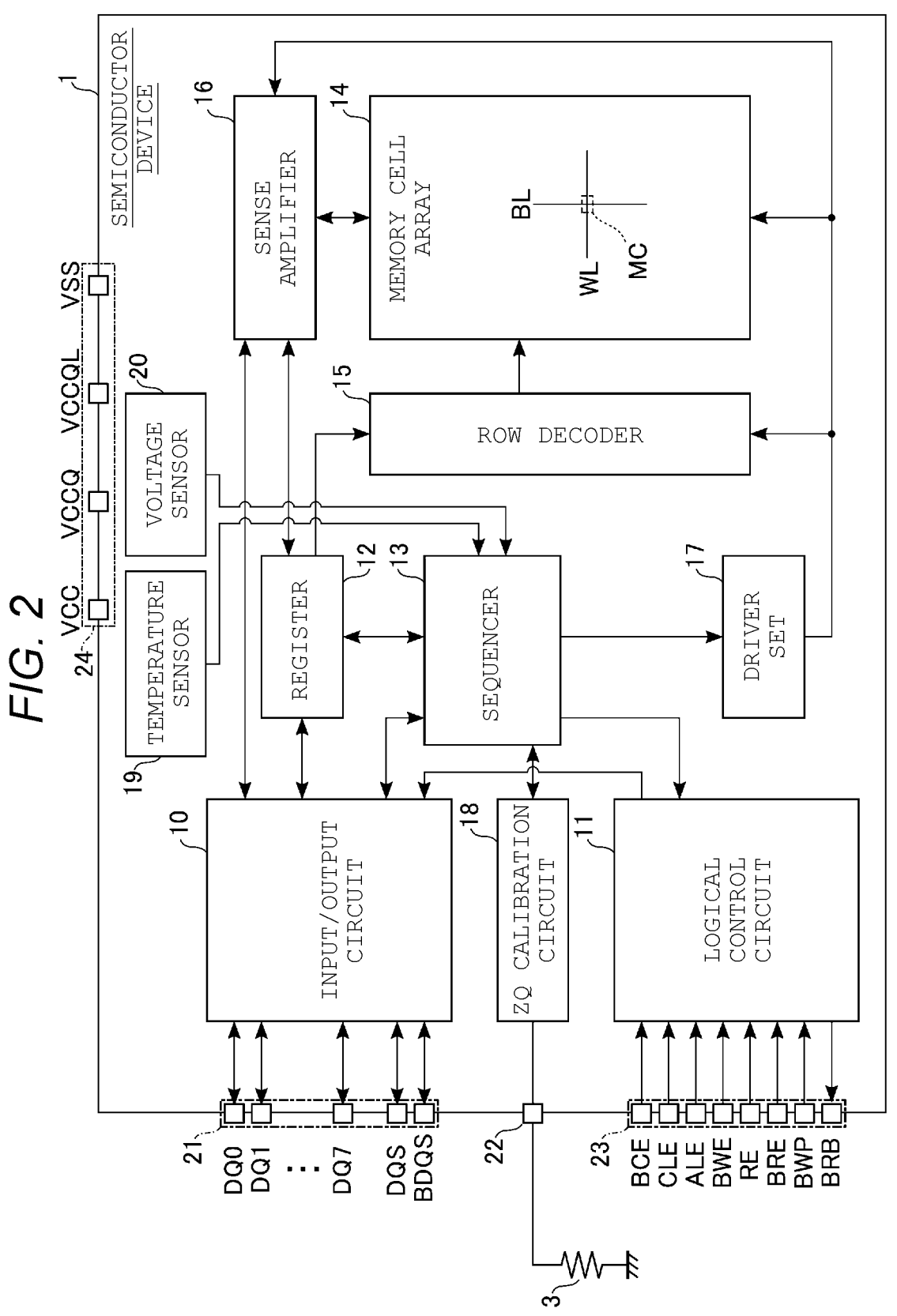
FIG. 2 is a block diagram illustrating an example of a configuration of the semiconductor device.

FIG. 2 is a block diagram illustrating an example of a configuration of the semiconductor device according to the first embodiment. As illustrated in FIG. 2, the semiconductor device 1 includes an input/output circuit 10, a logical control circuit 11, a register 12, a sequencer 13, a memory cell array 14, a row decoder 15, a sense amplifier 16, a driver set 17, a ZQ calibration circuit 18, a temperature sensor 19, a voltage sensor 20, an input/output pad group 21, a ZQ calibration pad 22, a logical control pad group 23, and a power pad group 24.

The input/output circuit 10 receives the signals DQ0 to DQ7, DOS, and BDQS from the memory controller 2. The input/output circuit 10 transmits the commands, the addresses, and the write data included in the received signals DQ0 to DQ7 to the register 12 and the sense amplifier 16. The input/output circuit 10 transmits the signals DQ0 to DQ7, DOS, and BDQS to the memory controller 2. The input/output circuit 10 generates the signals DQ0 to DQ7 based on read data from the sense amplifier 16. The input/output circuit 10 generates the signals DQS and BDQS based on a reference signal from the logical control circuit 11. The input/output circuit 10 changes an output impedance when the signals DQ0 to DQ7, DOS, and BDQS are transmitted based on control of the sequencer 13.

The logical control circuit 11 receives the signals BCE, CLE, ALE, BWE, RE, BRE, and BWP from the memory controller 2. The logical control circuit 11 generates the reference signal based on the signals RE and BRE. The logical control circuit 11 transmits the signal BRB to the memory controller 2.

The register 12 temporarily stores the commands and the addresses received via the input/output circuit 10. The register 12 transfers the addresses to the row decoder 15 and the sense amplifier 16. The register 12 transfers the commands to the sequencer 13.

The sequencer 13 controls an operation of the entire semiconductor device 1. For example, the sequencer 13 receives the commands from the register 12 and executes a read operation and the like based on the received commands. The sequencer 13 causes the ZQ calibration circuit 18 to execute a ZQ calibration operation based on the received command.

The memory cell array 14 stores data in a nonvolatile manner. The memory cell array 14 includes a plurality of bit lines BL, a plurality of word lines WL, and a plurality of memory cells MC. The plurality of memory cells MC are arranged in, for example, a row direction and a column direction. The plurality of bit lines BL are provided to correspond to the column direction and are connected to the plurality of memory cells MC corresponding to the same column. The plurality of word lines WL are provided to correspond to the row direction and are connected to the plurality of memory cells MC corresponding to the same row.

The row decoder 15 receives row addresses in the addresses from the register 12 and selects the memory cells MC in rows based on the row addresses. A voltage is transferred to the memory cells MC in the selected rows from the driver set 17 via the row decoder 15.

The sense amplifier 16 senses a threshold voltage of the memory cells MC during reading of data and transfers the read data based on a sense result to the input/output circuit 10. The sense amplifier 16 receives column addresses in the addresses from the register 12 and outputs data of columns based on the column addresses. The sense amplifier 16 transfers write data to be written to the memory cells MC via the bit lines BL during writing of the data.

The driver set 17 generates voltages used for operations of the memory cell array 14, the row decoder 15, and the sense amplifier 16.

The ZQ calibration circuit 18 executes a ZQ calibration operation of calibrating an output impedance of the input/output circuit 10 based on a resistant value of the resistance element 3.

The temperature sensor 19 measures a temperature inside the semiconductor device 1 and transmits a measurement result to the sequencer 13.

The voltage sensor 20 measures voltages applied to the semiconductor device 1 and transmits a measurement result to the sequencer 13. The voltage sensor 20 measures, for example, voltages VCC, VCCQ, and VCCQL and transmits measurement results to the sequencer 13.

The input/output pad group 21 transfers the signals DQ0 to DQ7, DOS, and BDQS received from the memory controller 2 to the input/output circuit 10. The input/output pad group 21 transfers the signals DQ0 to DQ7, DQS, and BDQS transmitted from the input/output circuit 10 to the outside of the semiconductor device 1.

The ZQ calibration pad 22 connects one end of the resistance element 3 provided outside of a package of the semiconductor device 1 to the ZQ calibration circuit 18.

The logical control pad group 23 transfers the signals BCE, CLE, ALE, BWE, RE, BRE, and BWP received from the memory controller 2 to the logical control circuit 11. The logical control pad group 23 transfers the signal BRB transmitted from the logical control circuit 11 to the outside of the semiconductor device 1.

Voltages are supplied to the power pad group 24 from the outside of the semiconductor device 1. The semiconductor device 1 operates using voltages VCC, VCCQ, VCCQL, and VSS supplied from the outside of the power pad group 24. The voltage VCC is, for example, a voltage of about 2.5 V. The voltage VCCQ is, for example, a voltage of about 1.2 V. The voltage VCCQL is, for example, a voltage of about 1.2 V. As the voltage VCCQL, a value equal to the voltage VCCQ or less than the voltage VCCQ is generally used. The voltage VSS is, for example, a ground voltage of 0 V. The voltage VCC is supplied to, for example, the logical control circuit 11, the register 12, the sequencer 13, the memory cell array 14, the row decoder 15, the sense amplifier 16, the driver set 17, the temperature sensor 19, and the voltage sensor 20. The voltage VCCQ is supplied to, for example, the input/output circuit 10. The voltage VCCQL is supplied to, for example, the input/output circuit 10 and the ZQ calibration circuit 18. The voltages VCC, VCCQ, and VCCQL are each also called a power voltage. The voltage VSS is also called a ground voltage.

<1-1-3> Configuration of ZQ Calibration Circuit 18

Figure 3:
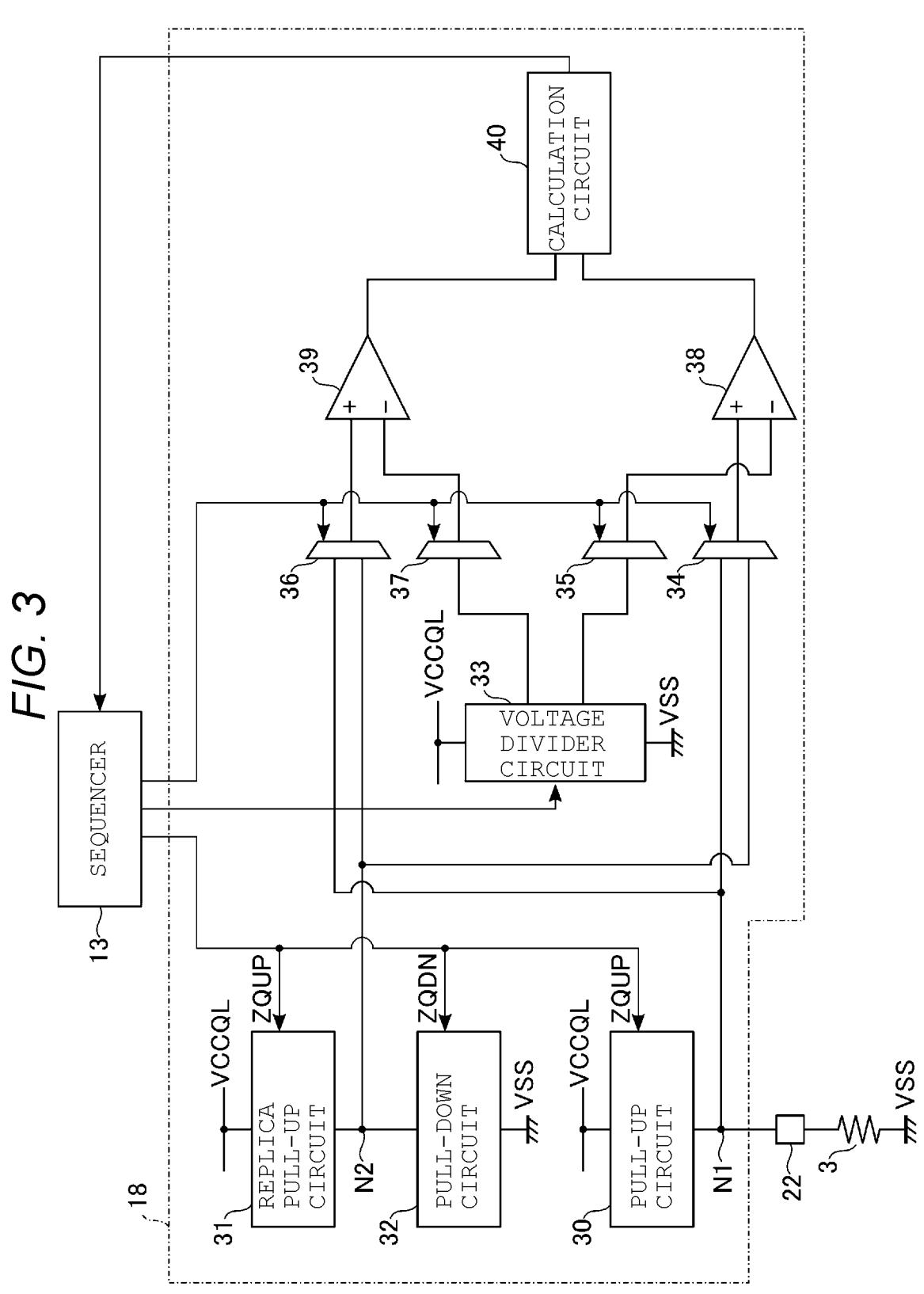
FIG. 3 is a block diagram illustrating a configuration example of a ZQ calibration circuit, a resistance element, and a sequencer of the semiconductor device.

FIG. 3 is a block diagram illustrating a configuration example of a ZQ calibration circuit, a resistance element, and a sequencer of the semiconductor device according to the first embodiment. As illustrated in FIG. 3, the ZQ calibration circuit 18 includes a pull-up circuit 30, a replica pull-up circuit 31, a pull-down circuit 32, a voltage divider circuit 33, selectors 34 to 37, comparators 38 and 39, and a calculation circuit 40. The pull-up circuit 30, the replica pull-up circuit 31, and the pull-down circuit 32 are mock of an OCD (Off-Chip Driver) circuit in the input/output circuit 10.

In the pull-up circuit 30, the voltage VCCQL is supplied as a power voltage and a control signal ZQUP is received from the sequencer 13. The pull-up circuit 30 changes a value of an output impedance of the pull-up circuit 30 according to the received control signal ZQUP. The pull-up circuit 30 operates to shift a voltage of a node N1 to the voltage VCCQL, that is, pulls up a voltage of the node N1 in accordance with the changed output impedance of the pull-up circuit 30.

The ZQ calibration pad 22 is connected to the node N1. One end of the resistance element 3 is connected to the ZQ calibration pad 22. The other end of the resistance element 3 is grounded. Accordingly, a voltage VN1 which is a voltage determined according to a relation between an output impedance of the pull-up circuit 30 and an impedance of the resistance element 3 is generated at the node N1. A voltage of the node N1 is substantially the same as a voltage of the ZQ calibration pad 22.

The replica pull-up circuit 31 has a configuration and a function similar to those of the pull-up circuit 30. That is, in the replica pull-up circuit 31, the voltage VCCQL is supplied as a power voltage and the control signal ZQUP is received from the sequencer 13. The replica pull-up circuit 31 changes a value of an output impedance of the replica pull-up circuit 31 according to the received control signal ZQUP. The replica pull-up circuit 31 operates to shift a voltage of a node N2 to the voltage VCCQL, that is, pulls up a voltage of the node N2 in accordance with the changed output impedance. The replica pull-up circuit 31 and the pull-up circuit 30 have similar configurations and set output impedances based on the same control signal ZQUP. Therefore, the output impedance of the replica pull-up circuit 31 is substantially equal to the output impedance of the pull-up circuit 30.

In the pull-down circuit 32, a power terminal is grounded and a control signal ZQDN is received from the sequencer 13. The pull-down circuit 32 changes a value of an output impedance of the pull-down circuit 32 by the received control signal ZQDN. The pull-down circuit 32 operates to shift a voltage of the node N2 to the ground voltage, that is, pulls down a voltage of the node N2 in accordance with the changed output impedance. As a result, a voltage VN2 based on a relation between the output impedance of the replica pull-up circuit 31 and the output impedance of the pull-down circuit 32 is generated at the node N2.

The voltages VCCQL and VSS are supplied to the voltage divider circuit 33. The voltage divider circuit 33 generates a plurality of voltages equal to or higher than the voltage VSS and equal to or lower than the voltage VCCQL. The voltage divider circuit 33 receives a control signal from the sequencer 13 and outputs a voltage generated according to the control signal.

Based on control of the sequencer 13, the selector 34 transfers either the voltage VN1 of the node N1 or the voltage VN2 of the node N2 to a non-inversion input terminal of the comparator 38.

Based on control of the sequencer 13, the selector 35 transfers an output of the voltage divider circuit 33 to an inversion input terminal of the comparator 38.

Based on control of the sequencer 13, the selector 36 transfers either the voltage VN1 of the node N1 or the voltage VN2 of the node N2 to a non-inversion input terminal of the comparator 39.

Based on control of the sequencer 13, the selector 37 transfers an output of the voltage divider circuit 33 to an inversion input terminal of the comparator 39.

The comparator 38 compares a voltage supplied to the non-inversion input terminal with a voltage supplied to the inversion input terminal and transmits a comparison result to the calculation circuit 40.

The comparator 39 compares a voltage supplied to the non-inversion input terminal with a voltage supplied to the inversion input terminal and transmits a comparison result to the calculation circuit 40.

The calculation circuit 40 receives the comparison result of the comparator 38 and the comparison result of the comparator 39, executes calculation, and transmits a calculation result to the sequencer 13. The details of the calculation will be described below.

Figure 4:
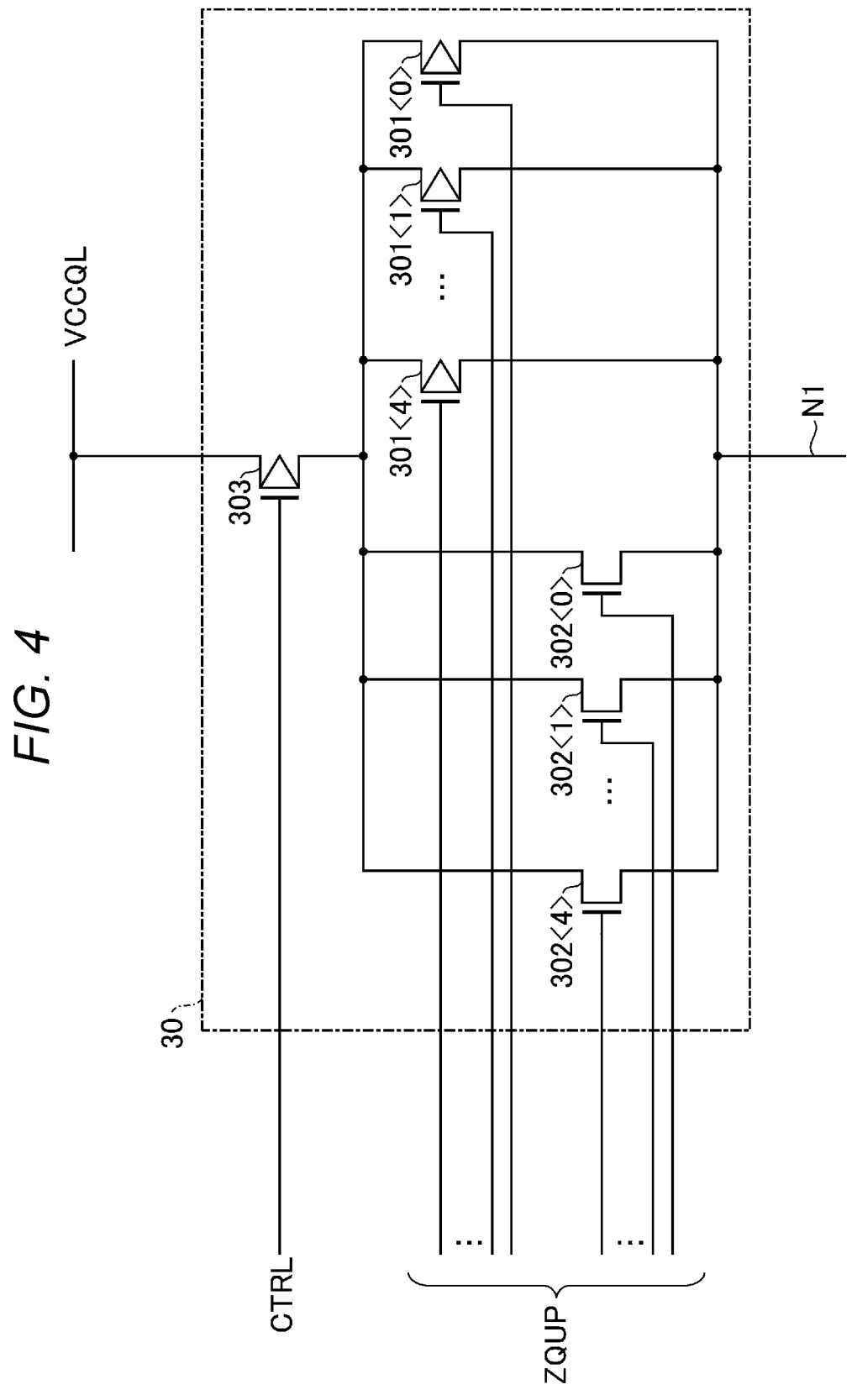
FIG. 4 is a circuit diagram illustrating a configuration example of a pull-up circuit of the semiconductor device.

FIG. 4 is a circuit diagram illustrating a configuration example of a pull-up circuit of the semiconductor device according to the first embodiment. The pull-up circuit 30 includes, for example, five transistors 301 <4:0>, five transistors 302 <4:0>, and a transistor 303.

Each of the transistors 301 <4:0> is a p-channel MOS transistor. In each of the transistors 301 <4:0>, a source is connected to a drain of the transistor 303 and a drain is connected to the node N1. Each of the transistors 301 <4:0> has a different current drive capability. For example, a size of a transistor 301 <m> is a multiple of size of a transistor 301 <m−1>. Specifically, a current drive capability of the transistor 301 <m> is a multiple of a current drive capability of the transistor 301 <m−1>. Here, m is an integer of 1 or more and 4 or less.

Each of the transistors 302 <4:0> is an n-channel MOS transistor. In each of the transistors 302 <4:0>, a drain is connected to the drain of the transistor 303 and a source is connected to the node N1. Each of the transistors 302 <4:0> has a different current drive capability. For example, a size of a transistor 302 <m> is a multiple of size of a transistor 302 <m−1>. Specifically, a current drive capability of the transistor 302 <m> is a multiple of a current drive capability of the transistor 302 <m−1>.

The transistor 303 is a p-channel MOS transistor. In the transistor 303, the voltage VCCQL is applied to a source.

The sequencer 13 supplies the control signal ZQUP to a gate of each of the transistors 301 <4:0> and a gate of each of the transistors 302 <4:0>. That is, in the present example, the control signal ZQUP is a 10-bit signal. Each of the transistors 301 <4:0> and each of the transistors 302 <4:0> are individually controlled to be turned on or off by the control signal ZQUP. The sequencer 13 supplies a control signal CTRL to the gate of the transistor 303. The transistor 303 is controlled to be turned on or off by the control signal CTRL.

In the foregoing configuration, in the pull-up circuit 30, transistors selected by the control signals ZQUP and CTRL enter an ON state. That is, while the transistor 303 is controlled to enter the ON state, the pull-up circuit 30 operates to shift a voltage of the node N1 to the voltage VCCQL at the output impedance corresponding to the control signal ZQUP.

The transistors 301<4:0> and the transistors 302<4:0> are separately used according to a termination scheme of a transmission line in which ZQ calibration is executed. Specifically, the transistors 301<4:0> are used when the termination scheme of the transmission line in which the ZQ calibration is executed is center tapped termination (CTT). The transistors 302<4:0> are used when the termination scheme of the transmission line in which the ZQ calibration is executed is low tapped termination (LTT).

Figure 5:
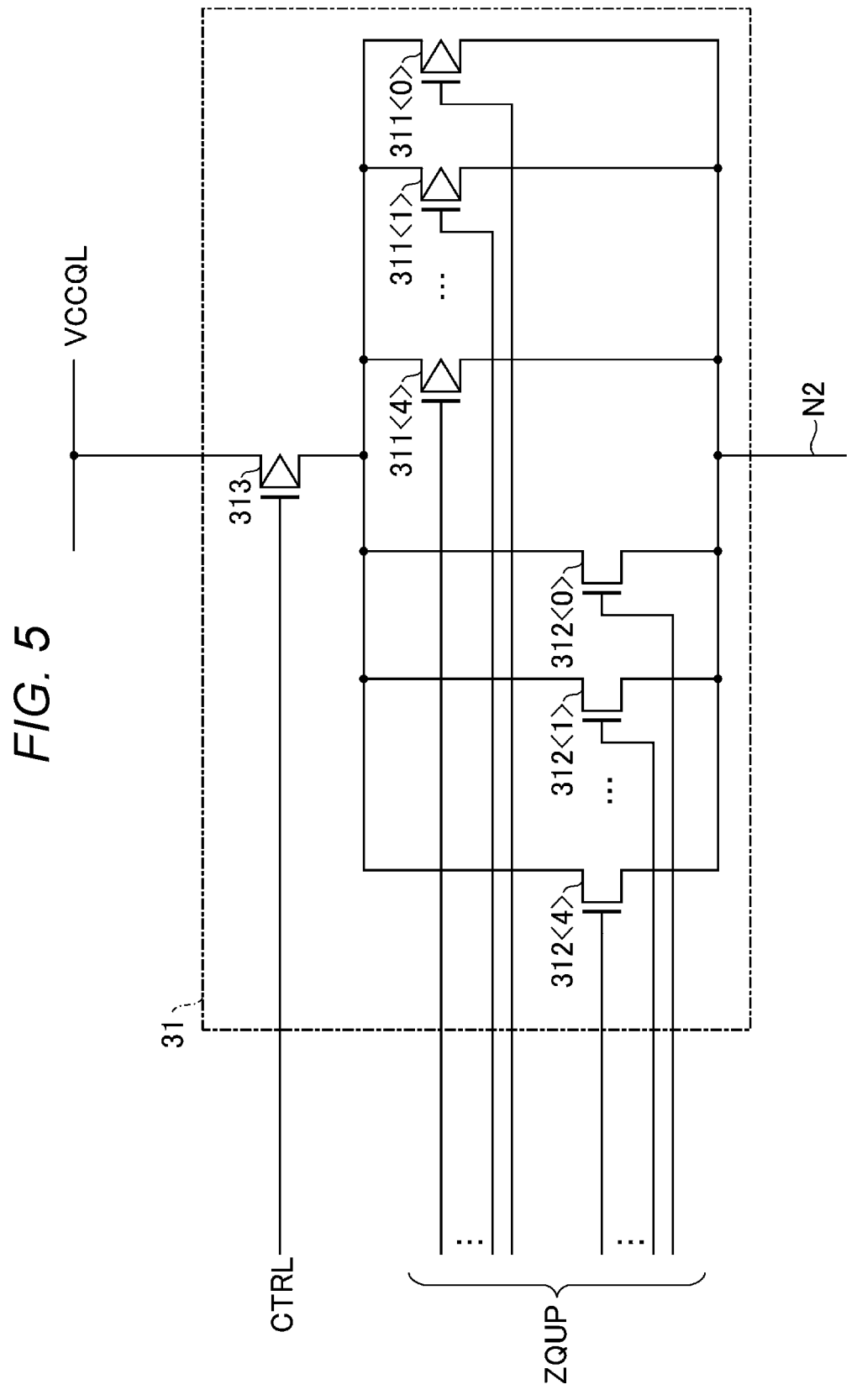
FIG. 5 is a circuit diagram illustrating a configuration example of a replica pull-up circuit of the semiconductor device.

FIG. 5 is a circuit diagram illustrating a configuration example of a replica pull-up circuit of the semiconductor device according to the first embodiment. The replica pull-up circuit 31 includes, for example, five transistors 311<4:0>, five transistors 312<4:0>, and a transistor 313.

Each of the transistors 311<4:0> is a p-channel MOS transistor. In each of the transistors 311<4:0>, a source is connected to a drain of the transistor 313 and a drain is connected to the node N2. Each of the transistors 311<4:0> has a different current drive capability. For example, a size of a transistor 311<m> is a multiple of size of a transistor 311<m−1>. Specifically, a current drive capability of the transistor 311<m> is a multiple of a current drive capability of the transistor 311<m−1>.

Each of the transistors 312<4:0> is an n-channel MOS transistor. In each of the transistors 312<4:0>, a drain is connected to the drain of the transistor 313 and a source is connected to the node N2. Each of the transistors 312<4:0> has a different current drive capability. For example, a size of a transistor 312<m> is a multiple of size of a transistor 312<m−1>. Specifically, a current drive capability of the transistor 312<m> is a multiple of a current drive capability of the transistor 312<m−1>.

The transistor 313 is a p-channel MOS transistor. In the transistor 313, the voltage VCCQL is applied to a source.

The sequencer 13 supplies the control signal ZQUP to a gate of each of the transistors 311<4:0> and a gate of each of the transistors 312<4:0>. That is, in the present example, the control signal ZQUP is a 10-bit signal. Each of the transistors 311<4:0> and each of the transistors 312 <4:0> are individually controlled to be turned on or off by the control signal ZQUP. The sequencer 13 supplies the control signal CTRL to the gate of the transistor 313. The transistor 313 is controlled to be turned on or off by the control signal CTRL.

In the foregoing configuration, in the replica pull-up circuit 31, transistors selected by the control signals ZQUP and CTRL enter an ON state. That is, while the transistor 313 is controlled to enter the ON state, the replica pull-up circuit 31 operates to shift a voltage of the node N2 to the voltage VCCQL at the output impedance corresponding to the control signal ZQUP.

The transistors 311<4:0> and the transistors 312<4:0> are separately used according to a termination scheme of a transmission line in which ZQ calibration is executed. Specifically, the transistors 311<4:0> are used when the termination scheme of the transmission line in which the ZQ calibration is executed is CTT. The transistors 312 <4:0> are used when the termination scheme of the transmission line in which the ZQ calibration is executed is LTT.

Figure 6:
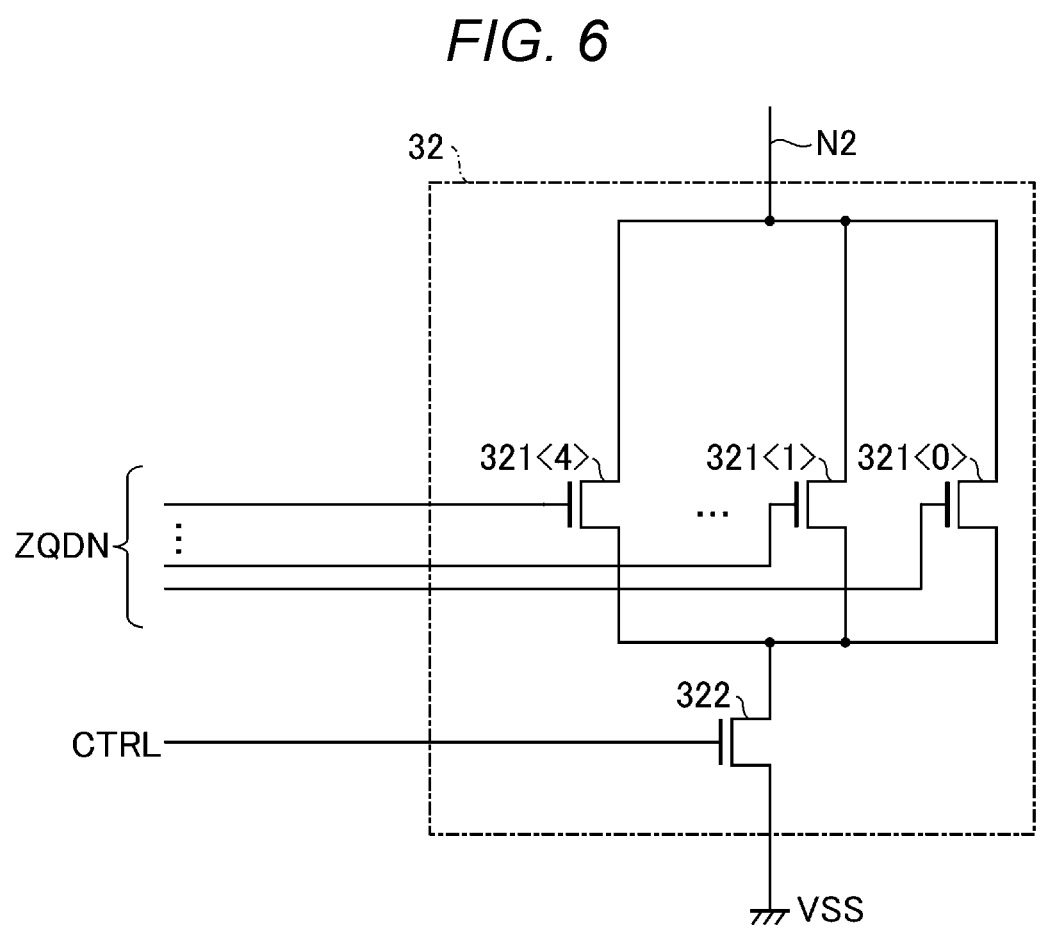

FIG. 6 is a circuit diagram illustrating a configuration example of a pull-down circuit of the semiconductor device according to the first embodiment. The pull-down circuit 32 includes, for example, five transistors 321<4:0> and a transistor 322.

Each of the transistors 321<4:0> is an n-channel MOS transistor. In each of the transistors 321<4:0>, a source is connected to a drain of the transistor 322 and a drain is connected to the node N2. Each of the transistors 321<4:0> has a different current drive capability. For example, a size of a transistor 321<m> is a multiple of size of a transistor 321<m−1>. Specifically, a current drive capability of the transistor 321<m> is a multiple of a current drive capability of the transistor 321<m−1>.

The transistor 322 is an n-channel MOS transistor. A source of the transistor 322 is grounded.

The sequencer 13 supplies the control signal ZQDN to a gate of each of the transistors 321<4:0>. That is, in the present example, the control signal ZQDN is a 5-bit signal. Each of the transistors 321<4:0> are individually controlled to be turned on or off by the control signal ZQDN. The sequencer 13 supplies the control signal CTRL to the gate of the transistor 322. The transistor 322 is controlled to be turned on or off by the control signal CTRL.

In the foregoing configuration, in the pull-down circuit 32, transistors selected by the control signals ZQDN and CTRL enter an ON state. That is, while the transistor 322 is controlled to enter the ON state, the pull-down circuit 32 operates to shift a voltage of the node N2 to the voltage VSS at the output impedance corresponding to the control signal ZQDN.

Figure 7:
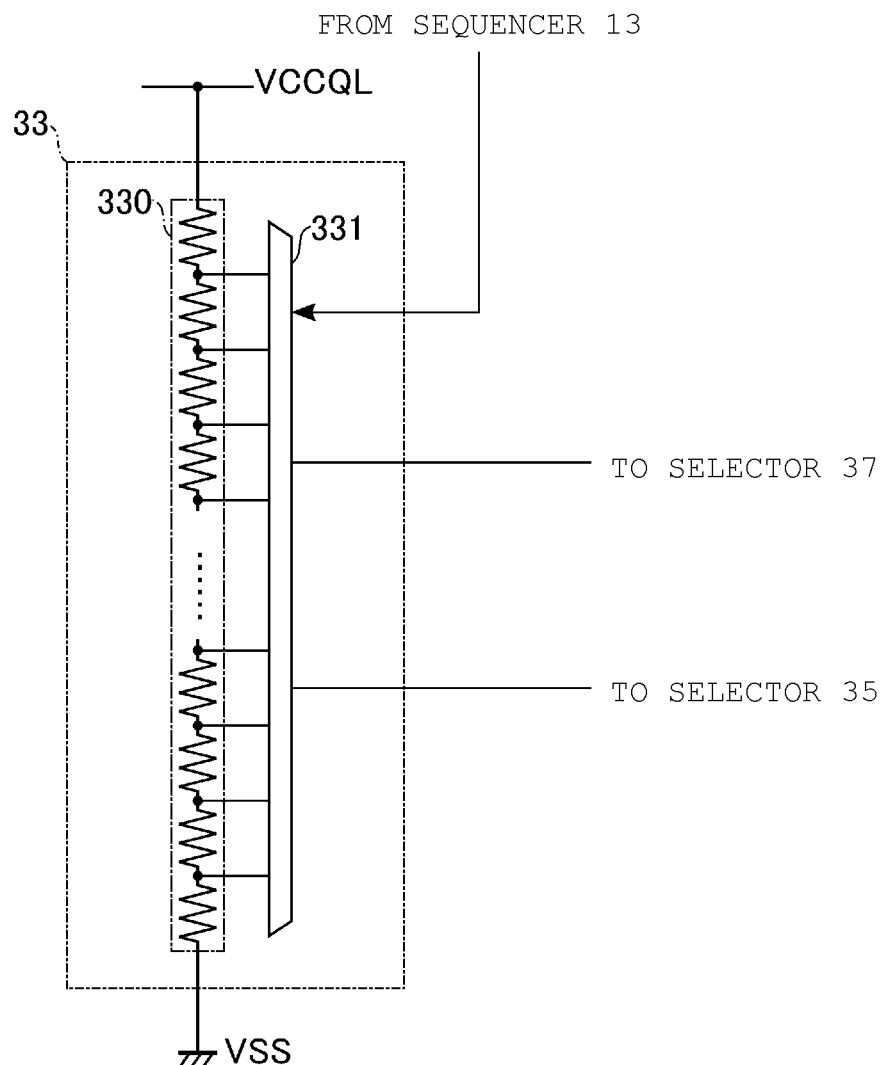
FIG. 7 is a circuit diagram illustrating a configuration example of a voltage divider circuit of the semiconductor device.

FIG. 7 is a circuit diagram illustrating a configuration example of a voltage divider circuit of the semiconductor device according to the first embodiment. The voltage divider circuit 33 includes a plurality of resistors 330 and a selector 331.

The plurality of resistors 330 are connected in series, the voltage VCCQL is supplied to one end of the series connection, and the other end is grounded. The voltage VCCQL is divided into a plurality of voltages by the plurality of resistors 330 connected in series. The plurality of divided voltages are input to the selector 331. The selector 331 transmits one of the plurality of input voltages to the selector 35 and transmits one of the plurality of input voltages to the selector 37 based on control of the sequencer 13.

<1-2> Operation

An operation of the semiconductor device 1 according to the first embodiment will be described.

<1-2-1> Overview of ZQ Calibration Operation

A ZQ calibration operation is an operation of adjusting an output impedance of the semiconductor device 1 to an appropriate impedance. The ZQ calibration operation is desirable when communication is executed at a high speed between the memory controller 2 and the semiconductor device 1. The ZQ calibration operation is executed after the semiconductor device 1 sets the output impedance or when the output impedance is changed due to an external environment.

The ZQ calibration operation is executed when the semiconductor device 1 does not execute any operation. When the ZQ calibration operation is executed, all devices connected to a DQ bus are set to a high impedance.

The ZQ calibration operation is broadly classified into a long calibration operation and a short calibration operation.

The long calibration operation is executed, for example, with an F9h command. When the long calibration operation is executed, an appropriate output impedance is searched for and set according to a power voltage and a temperature during execution. The long calibration operation is executed, for example, immediately after a power voltage is supplied to the semiconductor device 1 and an operation is started.

The short calibration operation is executed, for example, with a D9h command. The short calibration operation is an operation executed for a time shorter than the long calibration operation. In the short calibration operation, a setting value is shifted so that the output impedance of the semiconductor device 1 becomes closer to the appropriate output impedance. The short calibration operation is executed periodically, for example, after the long calibration operation is executed.

The short calibration operation may not achieve proper calibration of the output impedance depending on a magnitude of the environmental change. For example, when a power voltage and/or temperature is shifted by 25 mV or 25° C. or more, the output impedance cannot be set to an appropriate value by the short calibration operation. In such a case, it is preferable to execute the long calibration operation.

Figure 8:
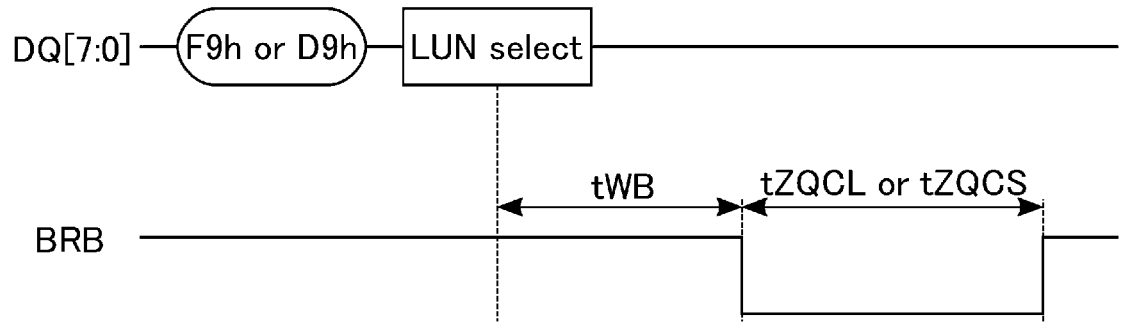
FIG. 8 is a timing chart illustrating an example of a ZQ calibration operation performed by the semiconductor device.

FIG. 8 is a timing chart illustrating an example of a ZQ calibration operation performed by the semiconductor device according to the first embodiment.

The ZQ calibration operation is executed for each logical unit number (LUN). An LUN address is required after the F9h or D9h command. When the F9h or D9h command and the LUN address are transmitted, the signal BRB enters the busy state after a period tWB passes, and the signal BRB returns to the ready state after a period tZQCL or tZQCS passes. The period tWB is a required period from when the signal BWE becomes an "H" level until when the signal BRB enters the busy state. The period tZQCL is a required period of the long calibration operation. The period tZQCS is a required period of the short calibration operation. The period tZQCL is longer than the period tZQCS.

<1-2-2> Details of Short Calibration Operation

The details of the short calibration operation will be described. FIG. 9 is a flowchart illustrating an example of the short calibration operation performed by the semiconductor device according to the first embodiment.

When the short calibration operation starts (START), the sequencer 13 sets the control signals ZQUP and ZQDN (S10). In the process, the output impedance of each of the pull-up circuit 30, the replica pull-up circuit 31, and the pull-down circuit 32 is set.

The sequencer 13 sets an output of the voltage divider circuit 33 (S11). Specifically, the sequencer 13 controls the selector 331 of the voltage divider circuit 33 such that a first reference voltage Vref1 is output to the selector 35 and a second reference voltage Vref2 is output to the selector 37. The first reference voltage Vref1 is a voltage lower by ΔVr than a target voltage Vtgt. The second reference voltage Vref2 is a voltage higher by ΔVr than the target voltage Vtgt. The target voltage Vtgt is a voltage equal to a voltage generated in the node N1 or N2 when the appropriate output impedance is set. The target voltage Vtgt is, for example, ½ of the voltage VCCQL when the termination scheme of the transmission line in which the ZQ calibration is executed is CTT. The target voltage Vtgt, for example, ⅓ of the voltage VCCQL when the termination scheme of the transmission line in which the ZQ calibration is executed is LTT.

Figure 10:
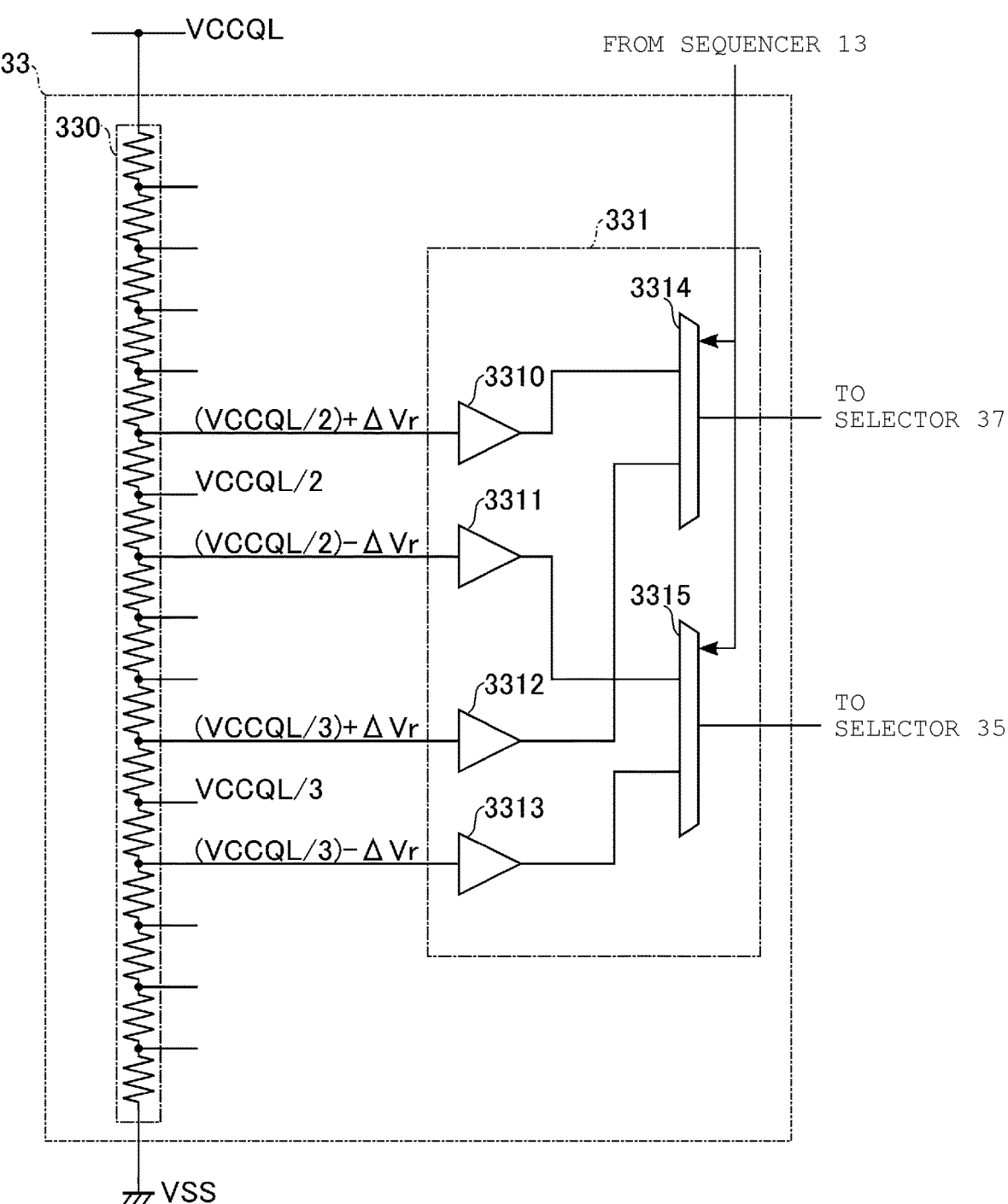
FIG. 10 is a circuit diagram illustrating a configuration example of the voltage divider circuit of the semiconductor device.

Here, generation of the first reference voltage Vref1 and the second reference voltage Vref2 will be described. FIG. 10 is a circuit diagram illustrating a configuration example of a voltage divider circuit of the semiconductor device according to the first embodiment. The selector 331 includes buffers 3310 to 3313 and selectors 3314 and 3315.

The plurality of resistors 330 are connected in series between the voltage VCCQL and the ground voltage VSS and divide the voltage VCCQL into a plurality of voltages.

The plurality of voltages include, for example, a voltage VCCQL/2, a voltage (VCCQL/2)−ΔVr, a voltage (VCCQL/2)+ΔVr, a voltage VCCQL/3, a voltage (VCCQL/3)−ΔVr, and a voltage (VCCQL/3)+ΔVr.

The voltage VCCQL/2 is a voltage used as the target voltage Vtgt when the termination scheme is CTT. The voltage (VCCQL/2)−ΔVr is a voltage used as the first reference voltage Vref1 when the termination scheme is CTT. The voltage (VCCQL/2)+ΔVr is a voltage used as the second reference voltage Vref2 when the termination scheme is CTT. The voltage VCCQL/3 is a voltage used as the target voltage Vtgt when the terminal scheme is LTT. The voltage (VCCQL/3)−ΔVr is a voltage used as the first reference voltage Vref1 when the termination scheme is LTT. The voltage (VCCQL/3)+ΔVr is a voltage used as the second reference voltage Vref2 when the termination scheme is LTT.

The voltage (VCCQL/2)+ΔVr is input to the buffer 3310. An output of the buffer 3310 is input to the selector 3314. The voltage (VCCQL/2)−ΔVr is input to the buffer 3311. An output of the buffer 3311 is input to the selector 3315. The voltage (VCCQL/3)+ΔVr is input to the buffer 3312. An output of the buffer 3312 is input to the selector 3314. The voltage (VCCQL/3)−ΔVr is input to the buffer 3313. An output of the buffer 3313 is input to the selector 3315. The selector 3314 transfers one of the input voltages to the selector 37 based on control of the sequencer 13. The selector 3315 transfers one of the input voltages to the selector 35 based on control of the sequencer 13.

The voltage divider circuit 33 is configured as such, so that the first reference voltage Vref1 can be transferred to the selector 35 and the second reference voltage Vref2 can be transferred to the selector 37 when the termination scheme is either CTT or LTT.

FIG. 9 is referred back for description. The sequencer 13 controls the selectors 34 and 36 such that the voltage VN1 is selected (S12). Through the process of step S11 and the process of step S12, the voltage VN1 and the first reference voltage Vref1 are input to the comparator 38, and the voltage VN1 and the second reference voltage Vref2 are input to the comparator 39. As a result, the comparators 38 and 39 output comparison results based on inputs to the calculation circuit 40. That is, the comparators 38 and 39 execute determination once.

The sequencer 13 receives a calculation result from the calculation circuit 40 (S13). Then, the sequencer 13 updates the control signal ZQUP based on the calculation result (S14). Specifically, the sequencer 13 maintains the control signal ZQUP at the same value or changes the control signal ZQUP so that the voltage VN1 is shifted by a voltage ΔV1 in a direction of the target voltage Vtgt. Through the process, the output impedances of the pull-up circuit 30 and the replica pull-up circuit 31 are updated to latest values.

The sequencer 13 controls the selectors 34 and 36 such that the voltage VN2 is selected (S15). Through the process, the voltage VN2 and the first reference voltage Vref1 are input to the comparator 38, and the voltage VN2 and the second reference voltage Vref2 are input to the comparator 39. As a result, the comparators 38 and 39 output comparison results based on inputs to the calculation circuit 40. That is, the comparators 38 and 39 execute determination once.

The sequencer 13 receives a calculation result from the calculation circuit 40 (S16). Then, the sequencer 13 updates the control signal ZQDN based on the calculation result (S17). Specifically, the sequencer 13 maintains the control signal ZQDN at the same value or changes the control signal ZQDN so that the voltage VN2 is shifted by a voltage ΔV1 in the direction of the target voltage Vtgt. Through the process, the output impedance of the pull-down circuit 32 is updated to a latest value.

The sequencer 13 sets the output impedance of the input/output circuit 10, specifically the output impedance of the OCD circuit, based on the control signals ZQUP and ZQDN (S18). The output buffer circuit output data read in the memory cell array 14. An output impedance value of the OCD circuit is written in a technical datasheet or a related document. The ZQ calibration circuit 18 calibrates the output impedance of the OCD circuit to match the output impedance value. Thus, the result of the calculation circuit 40 is reflected in the OCD circuit via the sequencer 13. By calibrating the pull-up circuit 30, the replica pull-up circuit 31 and the pull-down circuit 32, the OCD circuit is calibrated indirectly.

Then, the series of processes ends (END).

The voltage ΔVr which is a difference between the first reference voltage Vref1 and the second reference voltage Vref2, and the target voltage Vtgt, and the ΔV1 which is a change amount of the voltage VN1 or VN2 generated in step S14 and S17 satisfy, for example, the following Formula (1).

$$\Delta Vr < \Delta V1 < 2 \times \Delta Vr \tag{1}$$

Figures 11, 12:
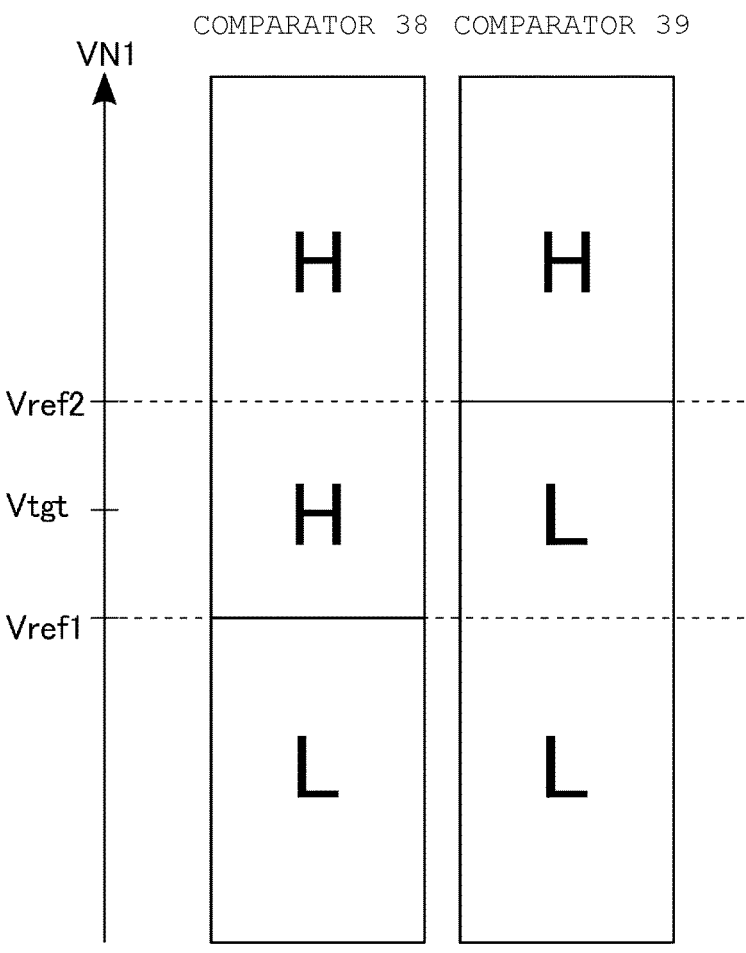
FIG. 11 is a diagram illustrating an example of an operation performed by a calculation circuit of the semiconductor device.
FIG. 12 is a table illustrating an example of an operation performed by the calculation circuit of the semiconductor device.

The details of calculation of the calculation circuit 40 will be described. FIG. 11 is a diagram illustrating an example of an operation performed by a calculation circuit of the semiconductor device according to the first embodiment. The vertical axis represents a value of the voltage VN1. A box written with H or L indicates that the comparators 38 and 39 output an "H" level or an "L" level. When the voltage VN1 is lower than the first reference voltage Vref1, the comparator 38 outputs the "L" level. When the voltage VN1 is higher than the first reference voltage Vref1, the comparator 38 outputs the "H" level. When the voltage VN1 is lower than the second reference voltage Vref2, the comparator 39 outputs the "L" level. When the voltage VN1 is higher than the second reference voltage Vref2, the comparator 39 outputs the "H" level. It can be understood that the value of the voltage VN1 can be partitioned into three ranges by combining the outputs of the comparators 38 and 39. Specifically, the value of the voltage VN1 can be partitioned into the three ranges depending on the following cases: a case in which the comparator 38 outputs the "H" level and the comparator 39 outputs the "H" level; a case in which the comparator 38 outputs the "H" level and the comparator 39 outputs the "L" level; and a case in which the comparator 38 outputs the "L" level and the comparator 39 outputs the "L" level. A case in which the comparator 38 outputs the "L" level and the comparator 39 outputs the "H" level does not exist because of contradiction with the premise that the first reference voltage Vref1 is lower than the second reference voltage Vref2.

FIG. 12 is a table illustrating an example of an operation performed by the calculation circuit of the semiconductor device according to the first embodiment. When the comparator 38 outputs the "H" level and the comparator 39 outputs the "H" level, the calculation circuit 40 determines that the voltage VN1 is higher than the target voltage Vtgt. When the comparator 38 outputs the "H" level and the comparator 39 outputs the "L" level, the calculation circuit 40 determines that the voltage VN1 is appropriate. When the comparator 38 outputs the "L" level and the comparator 39 outputs the "L" level, the calculation circuit 40 determines that the voltage VN1 is lower than the target voltage Vtgt. When the comparator 38 outputs the "L" level and the comparator 39 outputs the "H" level, the calculation circuit 40 determines that an error occurred.

The sequencer 13 updates the control signal ZQUP based on a determination result of the calculation circuit 40. Specifically, when the calculation circuit 40 determines that the voltage VN1 is high, the sequencer 13 updates the control signal ZQUP so that the voltage VN1 is lowered by the voltage ΔV1. When the calculation circuit 40 determines that the voltage VN1 is appropriate, the sequencer 13 maintains the control signal ZQUP. When the calculation circuit 40 determines that the voltage VN1 is low, the sequencer 13 updates the control signal ZQUP so that the voltage VN1 is raised by the voltage ΔV1. When the calculation circuit 40 determines an error, the sequencer 13 maintains the control signal ZQUP.

Description will be made specifically with reference to waveforms during an operation. FIGS. 13A to 13C and FIG. 14 are waveform diagrams illustrating an example of the short calibration operation performed by the semiconductor device according to the first embodiment. FIGS. 13A to 13C and FIG. 14 illustrate how the voltage VN1 changes before and after step S14. In each of FIGS. 13A to 13C and FIG. 14, the value of the voltage VN1 differs.

Figures 13A, 13B, 13C:
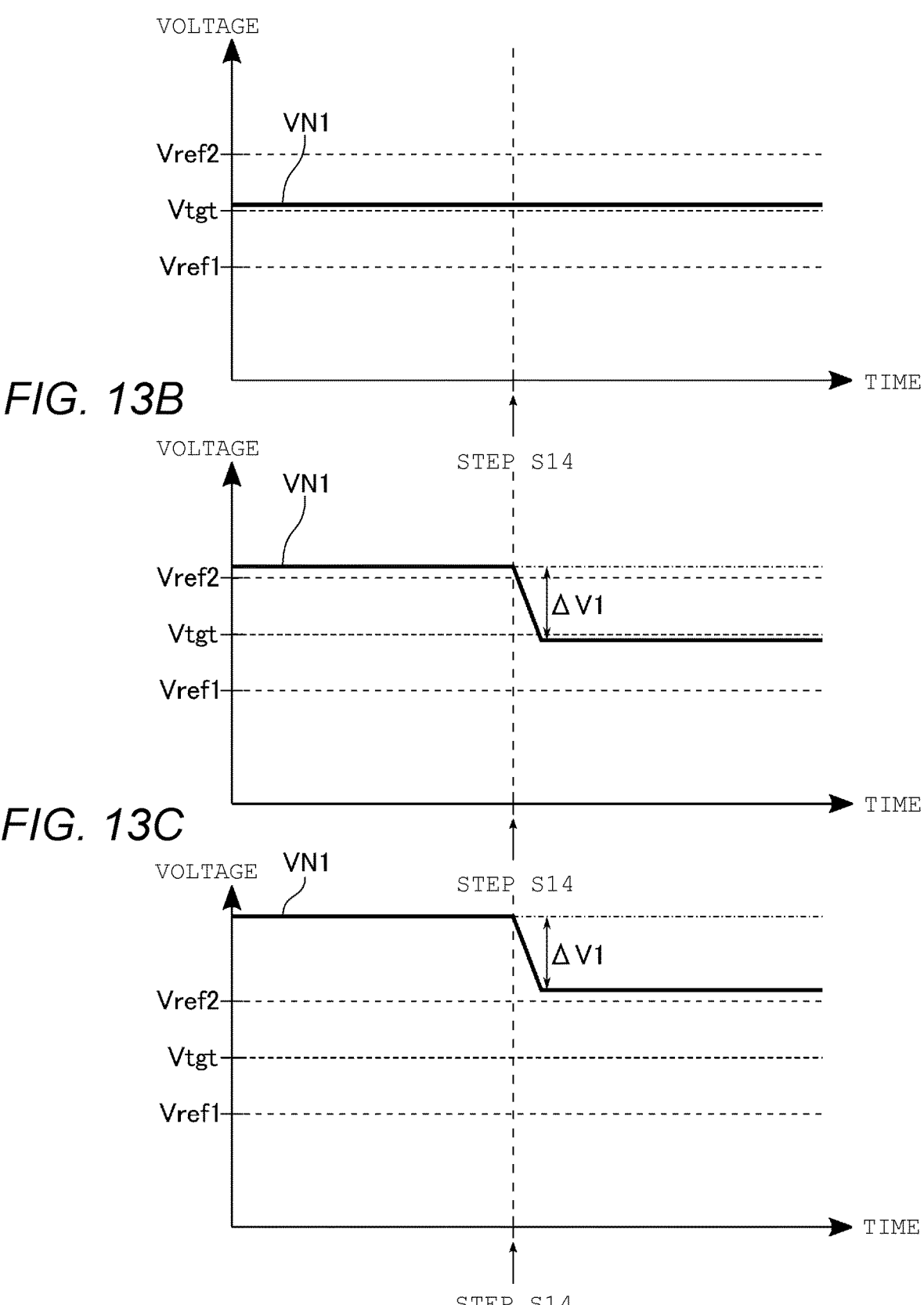
FIGS. 13A to 13C are waveform diagrams illustrating an example of the short calibration operation performed by the semiconductor device.

In the case of FIG. 13A, the voltage VN1 is higher than the first reference voltage Vref1 and lower than the second reference voltage Vref2. Accordingly, the calculation circuit 40 determines that the value of the voltage VN1 is appropriate, and thus the sequencer 13 maintains the control signal ZQUP in step S14. Therefore, when step S14 is executed, the voltage VN1 does not change.

In the case of FIG. 13B, the voltage VN1 is higher than the second reference voltage Vref2. Accordingly, the calculation circuit 40 determines that the voltage VN1 is high, and thus the sequencer 13 updates the control signal ZQUP in step S14 so that the voltage VN1 is lowered by the voltage ΔV1. Therefore, when step S14 is executed, the voltage VN1 is lowered by the voltage ΔV1.

In the case of FIG. 13C, the voltage VN1 is higher than the second reference voltage Vref2 and higher than in the case of FIG. 13B. Accordingly, the calculation circuit 40 determines that the voltage VN1 is high, and thus the sequencer 13 updates the control signal ZQUP in step S14 so that the voltage VN1 is lowered by the voltage ΔV1. Therefore, when step S14 is executed, the voltage VN1 is lowered by the voltage ΔV1.

Figure 14:
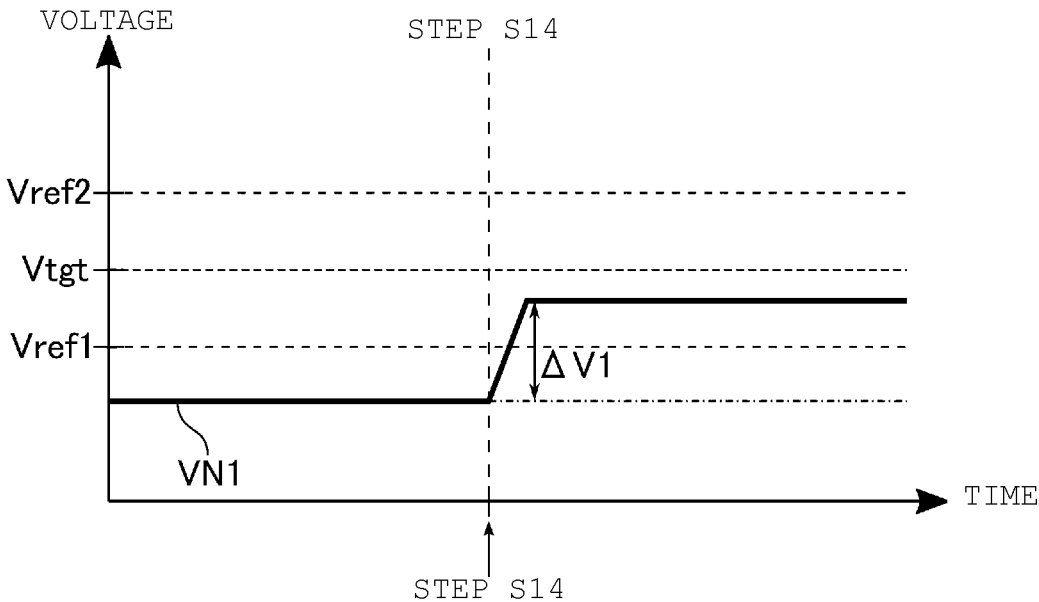
FIG. 14 is a waveform diagram illustrating an example of the short calibration operation performed by the semiconductor device.

In the case of FIG. 14, the voltage VN1 is lower than the first reference voltage Vref1. Accordingly, the calculation circuit 40 determines that the voltage VN1 is low, and thus the sequencer 13 updates the control signal ZQUP in step S14 so that the voltage VN1 is raised by the voltage ΔV1. Therefore, when step S14 is executed, the voltage VN1 is raised by the voltage ΔV1.

When the voltage VN2 is adjusted, it is similar to the cases in which the voltage VN1 is adjusted except that the control signal ZQUP is replaced with the control signal ZQDN.

<1-3> Advantages

In the semiconductor device 1 according to the above-described first embodiment, it is possible to improve operation reliability. Hereinafter, advantages of the semiconductor device according to the first embodiment will be described in detail.

In the ZQ calibration operation, the short calibration operation is executed in a short time. To execute the short calibration operation in a short time, the comparators execute the determination, for example, once for each of the voltages VN1 and VN2.

Here, a semiconductor device according to a comparative example will be described to compare with the semiconductor device according to the first embodiment. The semiconductor device according to the comparative example has a configuration in which the comparator 39 and the calculation circuit 40 are omitted and an output of the comparator 38 is connected to the sequencer 13 compared to the semiconductor device according to the first embodiment. That is, in the semiconductor device according to the comparative example, one comparator executes determination, and the control signals ZQUP and ZQDN are updated. Here, for example, the target voltage Vtgt is used as a reference voltage supplied to an inversion input terminal of the comparator.

The semiconductor device according to the comparative example determines whether the voltage VN1 is higher or lower than the reference voltage. The semiconductor device according to the comparative example does not determine how much the voltage VN1 is close to the reference voltage. The semiconductor device according to the comparative example shifts the voltage VN1 in a direction of the reference voltage in the short calibration operation. Therefore, no matter how the voltage VN1 is close to the reference voltage, the voltage VN1 is shifted based on a comparison with the reference voltage.

Figure 15:
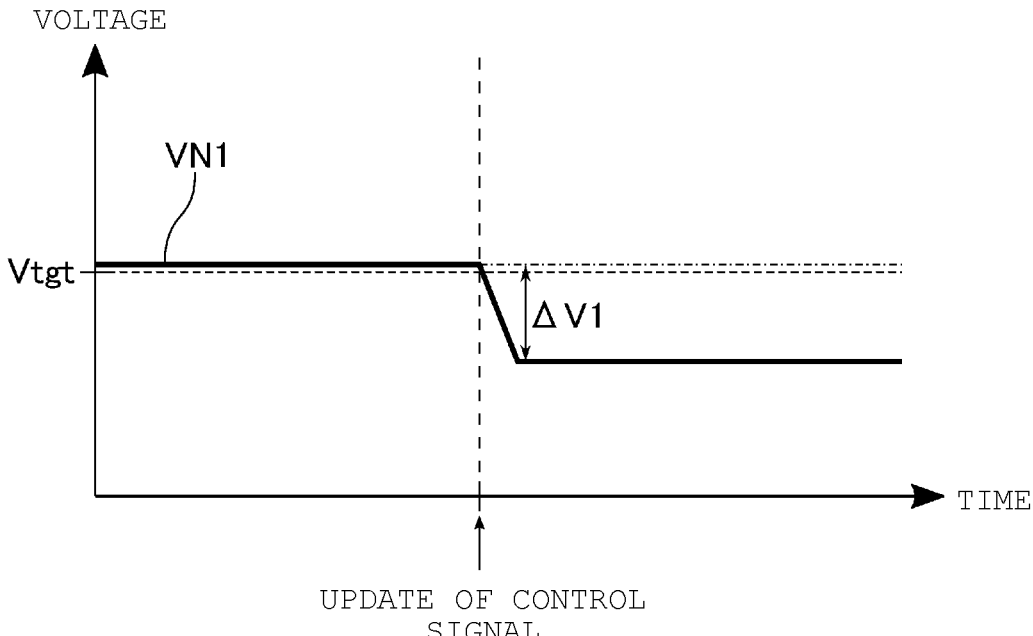
FIG. 15 is a waveform diagram illustrating an example of a short calibration operation performed by a semiconductor device according to a comparative example.

FIG. 15 is a waveform diagram illustrating an example of a short calibration operation performed by the semiconductor device according to the comparative example. As illustrated in FIG. 15, no matter how the voltage VN1 is close to the target voltage Vtgt which is a reference voltage, as the voltage VN1 is higher than the target voltage Vtgt, the voltage VN1 is shifted by the voltage ΔV1 in a negative direction. As a result, a difference between the voltage VN1 and the target voltage Vtgt becomes larger after update of the control signal than before update of the control signal. That is, an error of an output impedance increases by the short calibration operation.

Meanwhile, the semiconductor device 1 according to the first embodiment includes the comparators 38 and 39 and the calculation circuit 40. The comparator 38 compares the first reference voltage Vref1 with the voltage VN1 and the comparator 39 compares the second reference voltage Vref2 with the voltage VN1. Then, the calculation circuit 40 calculates whether the voltage VN1 is high, appropriate, or low based on an output of the comparator 38 and an output of the comparator 39. The sequencer 13 updates the control signal ZQUP based on a calculation result. Specifically, when the voltage VN1 is high, the voltage VN1 is shifted to the negative direction. When the voltage VN1 is appropriate, the control signal ZQUP is maintained. When the voltage VN1 is low, the voltage VN1 is shifted to a positive direction.

As such, the semiconductor device 1 according to the first embodiment can calculate whether the value of the voltage VN1 is high, appropriate, or low. When the value of the voltage VN1 is appropriate, the control signal ZQUP can be maintained without shifting the voltage VN1. Accordingly, the semiconductor device 1 according to the first embodiment can inhibit an error of the output impedance from increasing by the short calibration operation, and thus can improve operation reliability.

<2> Second Embodiment

A configuration of a semiconductor device 1a according to a second embodiment differs from the semiconductor device 1 according to the first embodiment in a configuration of a calculation circuit and a short calibration operation. Hereinafter, differences of the semiconductor device 1a according to the second embodiment from the first embodiment will be described.

<2-1> Configuration

<2-1-1> Configuration of ZQ Calibration Circuit 18a

Figure 16:
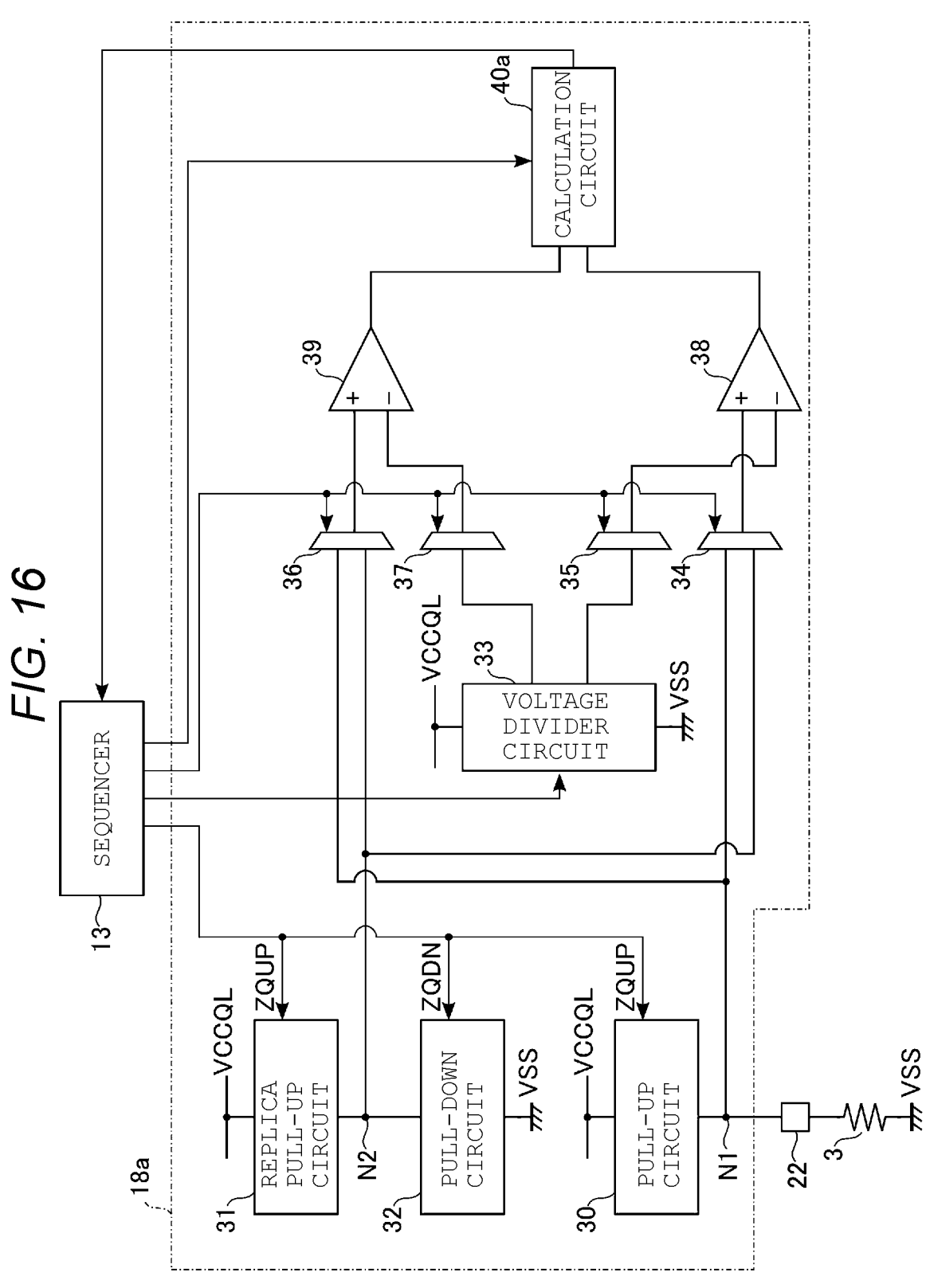
FIG. 16 is a block diagram illustrating a configuration example of a ZQ calibration circuit, a resistance element, and a sequencer of a semiconductor device according to a second embodiment.

FIG. 16 is a block diagram illustrating a configuration example of a ZQ calibration circuit, a resistance element, and a sequencer of a semiconductor device according to the second embodiment. A configuration of a ZQ calibration circuit 18a according to the second embodiment differs from the configuration of the ZQ calibration circuit 18 according to the first embodiment in a configuration of a calculation circuit.

A calculation circuit 40a can switch a calculation operation based on control of the sequencer 13.

The other configuration of the ZQ calibration circuit 18a is similar to the configuration of the ZQ calibration circuit 18 according to the first embodiment.

<2-2> Operation

Figure 17:
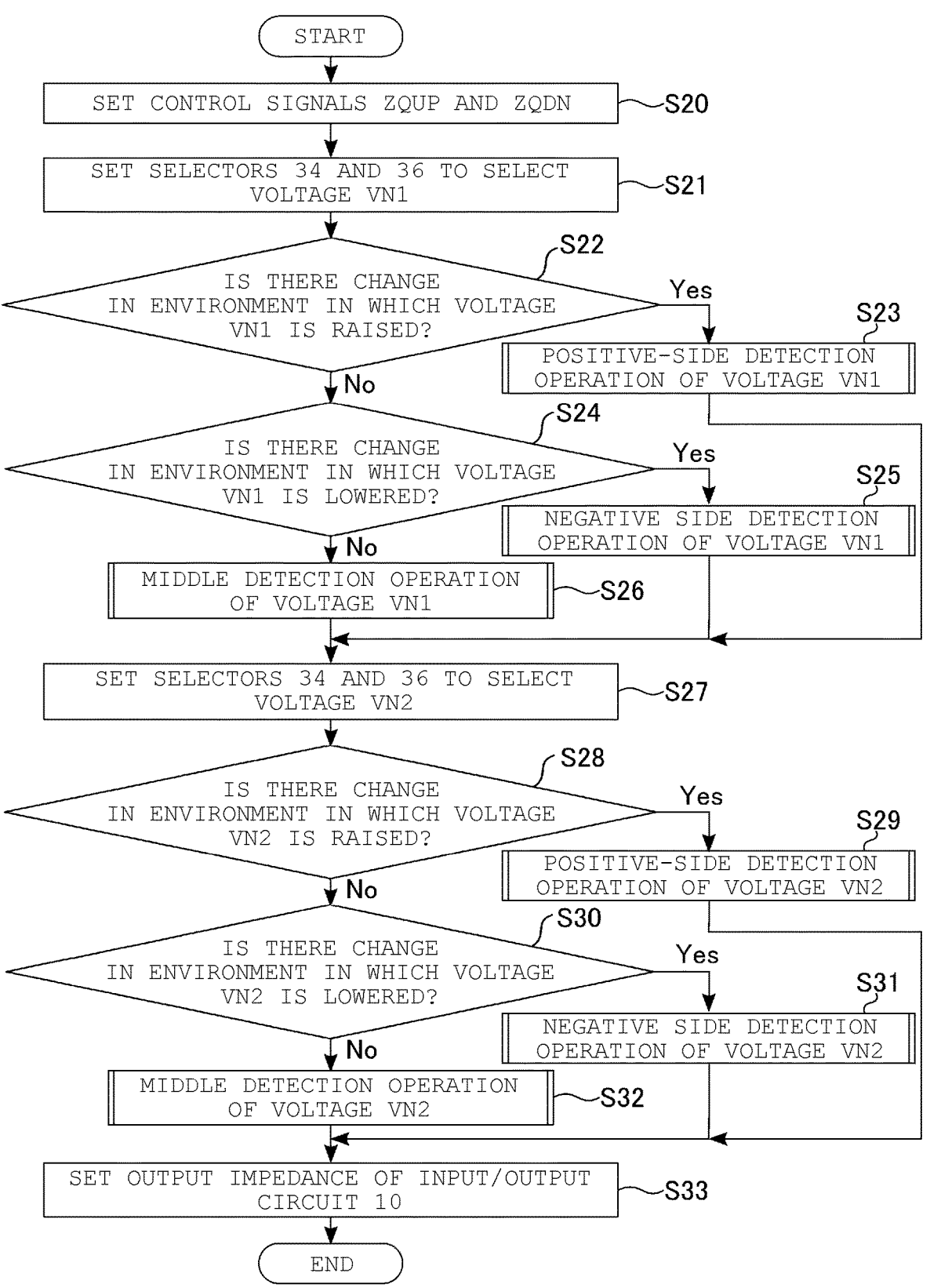
FIG. 17 is a flowchart illustrating an example of a short calibration operation performed by the semiconductor device.

A short calibration operation performed by the semiconductor device 1a according to the second embodiment will be described. FIG. 17 is a flowchart illustrating an example of a short calibration operation performed by the semiconductor device according to the second embodiment.

When the short calibration operation starts (START), the sequencer 13 sets the control signals ZQUP and ZQDN to current values (S20). In the process, the output impedance of each of the pull-up circuit 30, the replica pull-up circuit 31, and the pull-down circuit 32 is set.

The sequencer 13 controls the selectors 34 and 36 such that the voltage VN1 is selected (S21). Through the process, the voltage VN1 is supplied to a non-inversion input terminal of each of the comparators 38 and 39.

The sequencer 13 determines whether there is a change in an environment in which the voltage VN1 increases (S22). Specifically, with reference to outputs of the temperature sensor 19 and the voltage sensor 20, it is determined whether there is a change in the power voltage, a change in temperature, or the like in which the voltage VN1 is assumed to be raised between the present short calibration and a previous long calibration or short calibration. Specifically, for example, the voltage VN1 is lowered when the voltage VCCQL is lowered. When the voltage VCCQL is raised, the voltage VN1 is raised. When the temperature is raised, the voltage VN1 is lowered. When the temperature is lowered, the voltage VN1 is raised. When there is a change in the environment in which the voltage VN1 is raised (Yes in S22), a positive side detection operation of the voltage VN1 is executed (S23). The positive side detection operation of the voltage VN1 is a detection operation in which it is assumed that the voltage VN1 is changed to the positive side. The details of the positive side detection operation will be described below. When the positive side detection operation of the voltage VN1 is completed, an operation of step S27 is executed.

When there is no change in the environment in which the voltage VN1 is raised in step S22 (No in S22), the sequencer 13 determines whether there is a change in which the voltage VN1 is lowered (S24). Specifically, with reference to the outputs of the temperature sensor 19 and the voltage sensor 20, it is determined whether there is a change in the power voltage, a change in temperature, or the like in which the voltage VN1 is assumed to be lowered between the present short calibration and the previous long calibration or short calibration. When there is a change in the environment in which the voltage VN1 is lowered (Yes in S24), a negative side detection operation of the voltage VN1 is executed (S25). The negative side detection operation of the voltage VN1 is a detection operation in which it is assumed that the voltage VN1 is changed to the negative side. The details of the negative side detection operation will be described below. When the negative side detection operation of the voltage VN1 is completed, an operation of step S27 is executed.

When there is no change in the environment in which the voltage VN1 is lowered in step S24 (No in S24), a middle detection operation of the voltage VN1 is executed (S26). The middle detection operation of the voltage VN1 is a detection operation in which it is assumed that the voltage VN1 is not much changed. The details of the middle detection operation will be described below. When the middle detection operation of the voltage VN1 is completed, an operation of step S27 is executed.

In step S27, the sequencer 13 controls the selectors 34 and 36 such that the voltage VN2 is selected (S27). Through the process, the voltage VN2 is supplied to the non-inversion input terminal of each of the comparators 38 and 39.

The sequencer 13 determines whether there is a change in an environment in which the voltage VN2 is raised (S28). Specifically, with reference to outputs of the temperature sensor 19 and the voltage sensor 20, it is determined whether there is a change in the power voltage, a change in temperature, or the like in which the voltage VN2 is assumed to be raised between the present short calibration and the previous long calibration or short calibration. When there is a change in the environment in which the voltage VN2 is raised (Yes in S28), a positive side detection operation of the voltage VN2 is executed (S29). The positive side detection operation of the voltage VN2 is a detection operation in which it is assumed that the voltage VN2 is changed to the positive side. The details of the positive side detection operation will be described below. When the positive side detection operation of the voltage VN2 is completed, an operation of step S33 is executed.

When there is no change in the environment in which the voltage VN2 is raised in step S28 (No in S28), the sequencer 13 determines whether there is a change in which the voltage VN2 is lowered (S30). Specifically, with reference to the outputs of the temperature sensor 19 and the voltage sensor 20, it is determined whether there is a change in the power voltage, a change in temperature, or the like in which the voltage VN2 is assumed to be lowered between the present short calibration and the previous long calibration or short calibration. When there is a change in the environment in which the voltage VN2 is lowered (Yes in S30), a negative side detection operation of the voltage VN2 is executed (S31). The negative side detection operation of the voltage VN2 is a detection operation in which it is assumed that the voltage VN2 is changed to the negative side. The details of the negative side detection operation will be described below. When the negative side detection operation of the voltage VN2 is completed, an operation of step S33 is executed.

When there is no change in the environment in which the voltage VN2 is lowered in step S30 (No in S30), a middle detection operation of the voltage VN2 is executed (S32). The middle detection operation of the voltage VN2 is a detection operation in which it is assumed that the voltage VN2 is not much changed. The details of the middle detection operation will be described below. When the middle detection operation of the voltage VN2 is completed, an operation of step S33 is executed.

The sequencer 13 adjusts the output impedance of the input/output circuit 10 based on the control signals ZQUP and ZQDN (S33).

Then, the series of processes ends (END).

Figure 18:
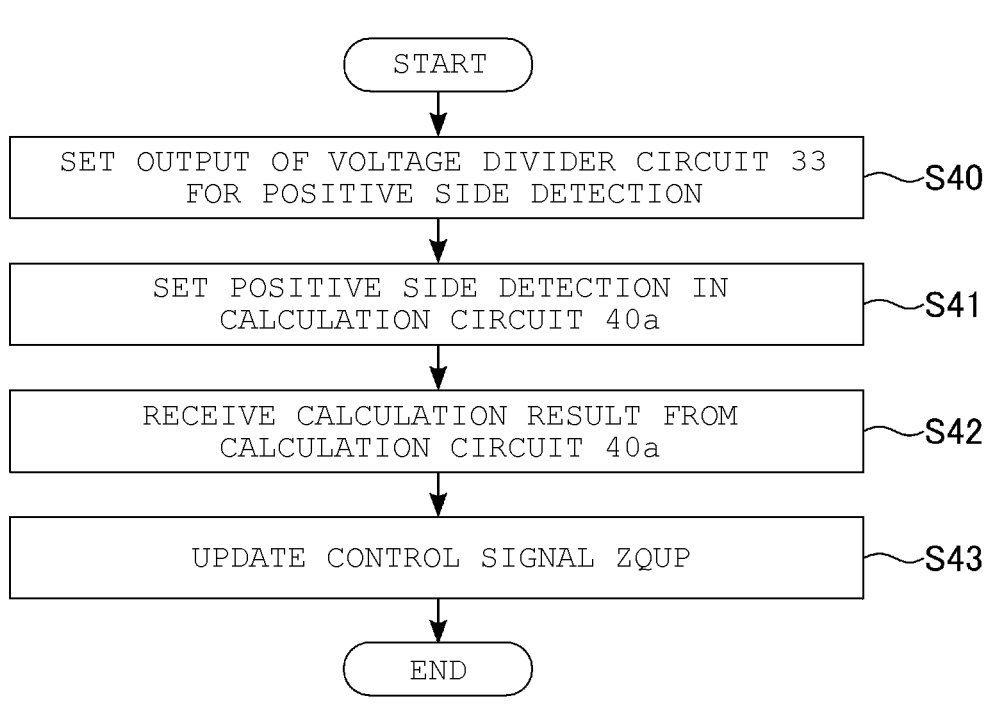
FIG. 18 is a flowchart illustrating an example of a positive side detection operation performed by the semiconductor device.

The positive side detection operation of the voltage VN1 will be described. FIG. 18 is a flowchart illustrating an example of the positive side detection operation of the voltage VN1 of the semiconductor device according to the second embodiment. When the positive side detection operation of the voltage VN1 starts (START), the sequencer 13 sets an output of the voltage divider circuit 33 for positive side detection (S40). Specifically, the sequencer 13 controls the selector 331 of the voltage divider circuit 33 such that a third reference voltage Vref3 is output to the selector 35 and a fourth reference voltage Vref4 is output to the selector 37. The third reference voltage Vref3 is a voltage higher by the voltage ΔVr than the target voltage Vtgt. The fourth reference voltage Vref4 is a voltage higher by a voltage ΔVs than the target voltage Vtgt. The voltage ΔVs is a voltage higher than the voltage ΔVr.

The sequencer 13 sets the calculation circuit 40a for positive side detection (S41).

The sequencer 13 receives a calculation result from the calculation circuit 40a (S42).

Then, the sequencer 13 updates the control signal ZQUP based on the calculation result (S43). Specifically, the control signal ZQUP is changed to be shifted in a direction of the target voltage Vtgt by a voltage ΔV1, ΔV2, or (ΔV1)/2. The voltage ΔV2 is a voltage higher than the voltage ΔV1. The voltage (ΔV1)/2 is an example, and a voltage less than the voltage ΔV1 may be used. Through the process, the output impedances of the pull-up circuit 30 and the replica pull-up circuit 31 are updated to latest values.

Then, the positive side detection operation ends (END).

Figures 19, 20:
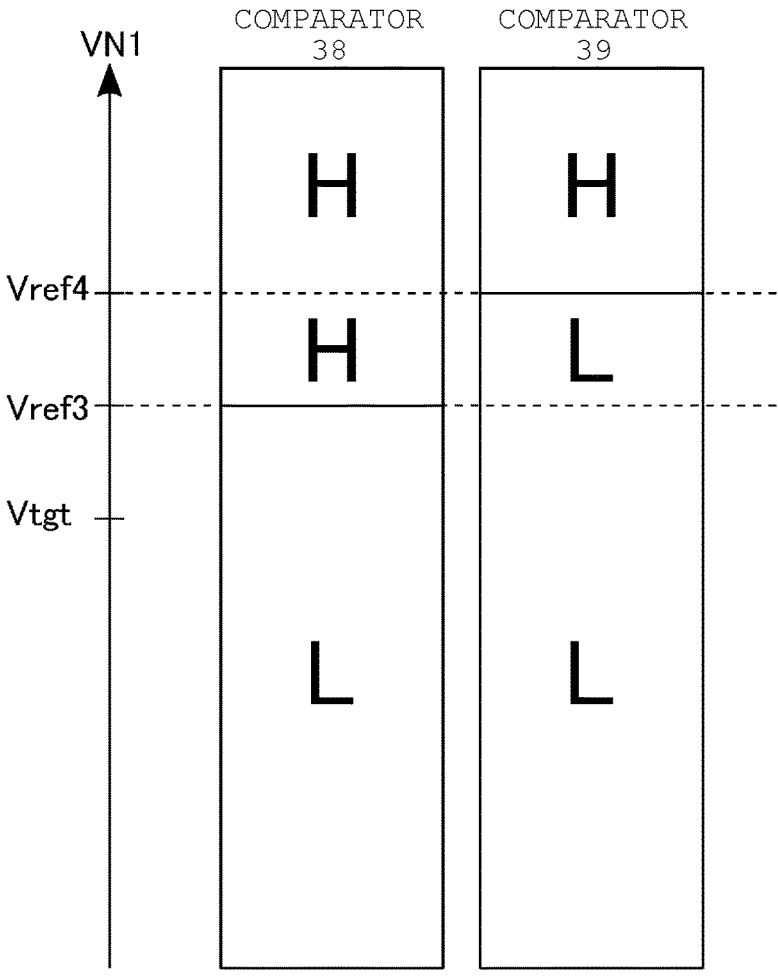
FIG. 19 is a diagram illustrating an example of an operation in a positive side detection operation performed by a calculation circuit of the semiconductor device.
FIG. 20 is a table illustrating an example of an operation performed by the calculation circuit of the semiconductor device.

The details of calculation of the calculation circuit 40a in the positive side detection operation will be described. FIG. 19 is a diagram illustrating an example of an operation in the positive side detection operation performed by the calculation circuit of the semiconductor device according to the second embodiment. The vertical axis represents a value of the voltage VN1. A box written with H or L indicates that the comparators 38 and 39 output an "H" level or an "L" level. When the voltage VN1 is lower than the third reference voltage Vref3, the comparator 38 outputs the "L" level. When the voltage VN1 is higher than the third reference voltage Vref3, the comparator 38 outputs the "H" level. When the voltage VN1 is lower than the fourth reference voltage Vref4, the comparator 39 outputs the "L" level. When the voltage VN1 is higher than the fourth reference voltage Vref4, the comparator 39 outputs the "H" level. It can be understood that the value of the voltage VN1 can be partitioned into three sections by combining the outputs of the comparators 38 and 39. Specifically, the value of the voltage VN1 can be partitioned into the following three cases: a case in which the comparator 38 outputs the "H" level and the comparator 39 outputs the "H" level; a case in which the comparator 38 outputs the "H" level and the comparator 39 outputs the "L" level; and a case in which the comparator 38 outputs the "L" level and the comparator 39 outputs the "L" level. The value of the voltage VN1 can be partitioned into the foregoing three cases. A case in which the comparator 38 outputs the "L" level and the comparator 39 outputs the "H" level does not exist because of contradiction with the premise that the third reference voltage Vref3 is lower than the fourth reference voltage Vref4.

FIG. 20 is a table illustrating an example of an operation performed by the calculation circuit of the semiconductor device according to the second embodiment. When the comparator 38 outputs the "H" level and the comparator 39 outputs the "H" level, the calculation circuit 40a determines that the voltage VN1 is higher than the target voltage. When the comparator 38 outputs the "H" level and the comparator 39 outputs the "L" level, the calculation circuit 40a determines that the voltage VN1 is slightly higher than the target voltage. When the comparator 38 outputs the "L" level and the comparator 39 outputs the "L" level, the calculation circuit 40a determines that the voltage VN1 is appropriate or the voltage VN1 is lower than the target voltage. When the comparator 38 outputs the "L" level and the comparator 39 outputs the "H" level, the calculation circuit 40a determines that an error occurred.

The sequencer 13 updates the control signal ZQUP based on a determination result of the calculation circuit 40a. Specifically, when the calculation circuit 40a determines that the voltage VN1 is considerably high, the sequencer 13 updates the control signal ZQUP so that the voltage VN1 is lowered by the voltage ΔV2. When the calculation circuit 40a determines that the voltage VN1 is slightly high, the sequencer 13 updates the control signal ZQUP so that the voltage VN1 is lowered by the voltage ΔV1. When the calculation circuit 40a determines that the voltage VN1 is appropriate or low, the sequencer 13 updates the control signal ZQUP so that the voltage VN1 is raised by the voltage (ΔV1)/2. When the calculation circuit 40a determines an error, the sequencer 13 maintains the control signal ZQUP.

The details of an update of the control signal ZQUP based on a determination result of the calculation circuit 40a will be described. When the calculation circuit 40a determines that the voltage VN1 is considerably high, it is expected that the voltage VN1 is considerably distant from the target voltage Vtgt. Therefore, to calibrate a considerably distant error, the sequencer 13 updates the control signal ZQUP so that the voltage VN1 is lowered by the voltage ΔV2 higher than the voltage ΔV1. When the calculation circuit 40a determines that the voltage VN1 is slightly high, it is expected that the voltage VN1 is slightly distant from the target voltage Vtgt. Therefore, to calibrate a slight error, the sequencer 13 updates the control signal ZQUP so that the voltage VN1 is lowered by the voltage ΔV1. When the calculation circuit 40a determines that the voltage VN1 is appropriate or low, the voltage VN1 is determined to be appropriate or low although a determination condition is set on the assumption that the voltage VN1 is raised. That is, it can be estimated that the voltage VN1 is very slightly lower than the target voltage Vtgt. Therefore, to calibrate a very slight error, the sequencer 13 updates the control signal ZQUP so that the voltage VN1 is raised by the voltage (ΔV1)/2.

Figures 21A, 21B, 21C:
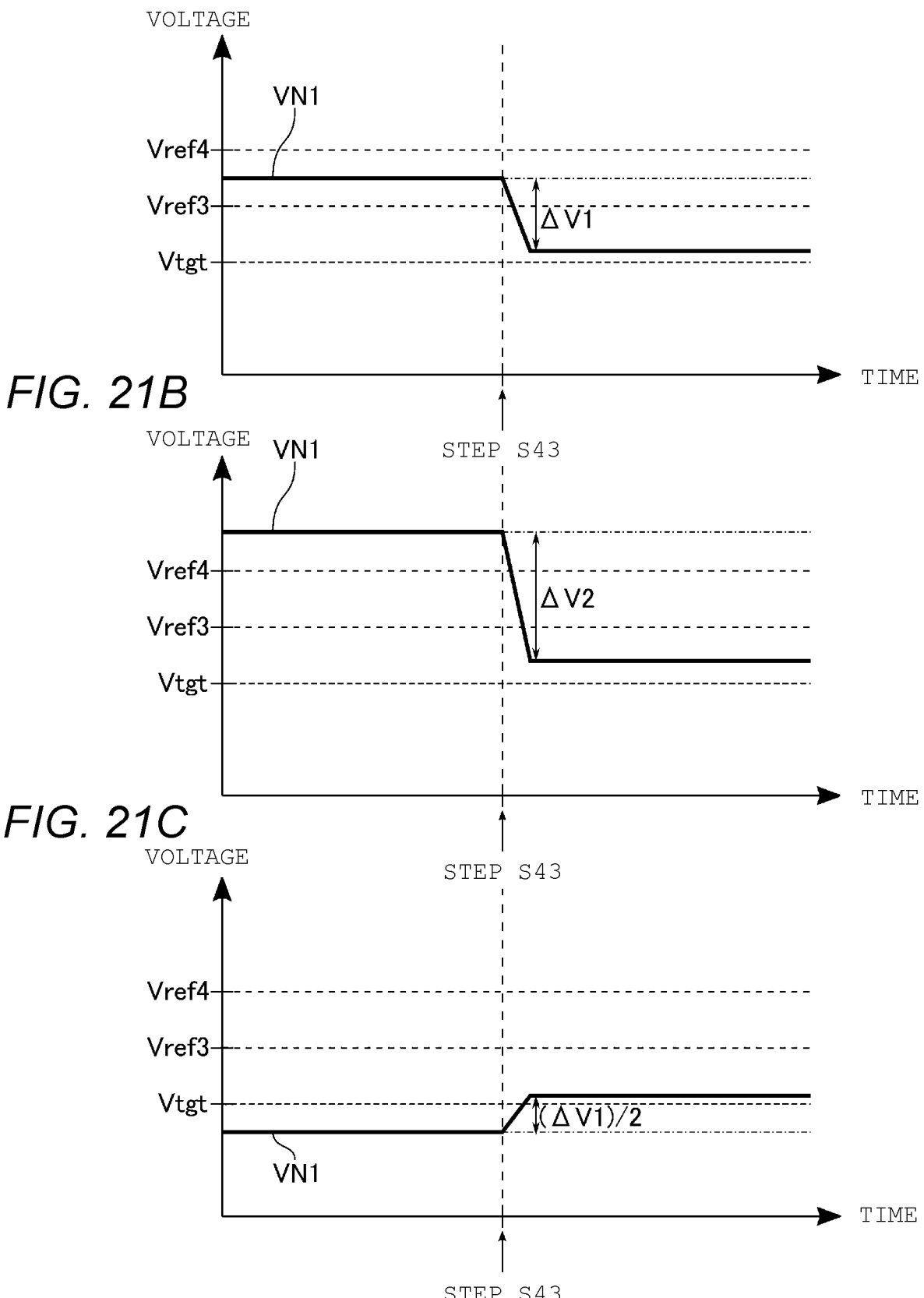
FIGS. 21A to 21C are waveform diagrams illustrating an example of the short calibration operation performed by the semiconductor device.

Description will be made specifically with reference to waveforms during an operation. FIGS. 21A to 21C are waveform diagrams illustrating an example of a short calibration operation performed by the semiconductor device according to the second embodiment. FIGS. 21A to 21C illustrate how the voltage VN1 changes before and after step S43. In each of FIGS. 21A to 21C, the value of the voltage VN1 differs.

In the case of FIG. 21A, the voltage VN1 is higher than the third reference voltage Vref3 and lower than the fourth reference voltage Vref4. Accordingly, the calculation circuit 40a determines that the value of the voltage VN1 is slightly high, and thus the sequencer 13 updates the control signal ZQUP in step S43 so that the voltage VN1 is lowered by the voltage ΔV1. Therefore, when step S43 is executed, the voltage VN1 is lowered by the voltage ΔV1.

In the case of FIG. 21B, the voltage VN1 is higher than the third reference voltage Vref3 and higher than the fourth reference voltage Vref4. Accordingly, the calculation circuit 40*a* determines that the voltage VN1 is considerably high, and thus the sequencer 13 updates the control signal ZQUP in step S43 so that the voltage VN1 is lowered by the voltage ΔV2. Therefore, when step S43 is executed, the voltage VN1 is lowered by the voltage ΔV2.

In the case of FIG. 21C, the voltage VN1 is lower than the third reference voltage Vref3 and lower than fourth reference voltage Vref4. Accordingly, the calculation circuit 40*a* determines that the voltage VN1 is appropriate or low, and thus the sequencer 13 updates the control signal ZQUP in step S43 so that the voltage VN1 is raised by the voltage (ΔV1)/2. Therefore, when step S43 is executed, the voltage VN1 is raised by the voltage (ΔV1)/2.

Figure 22:
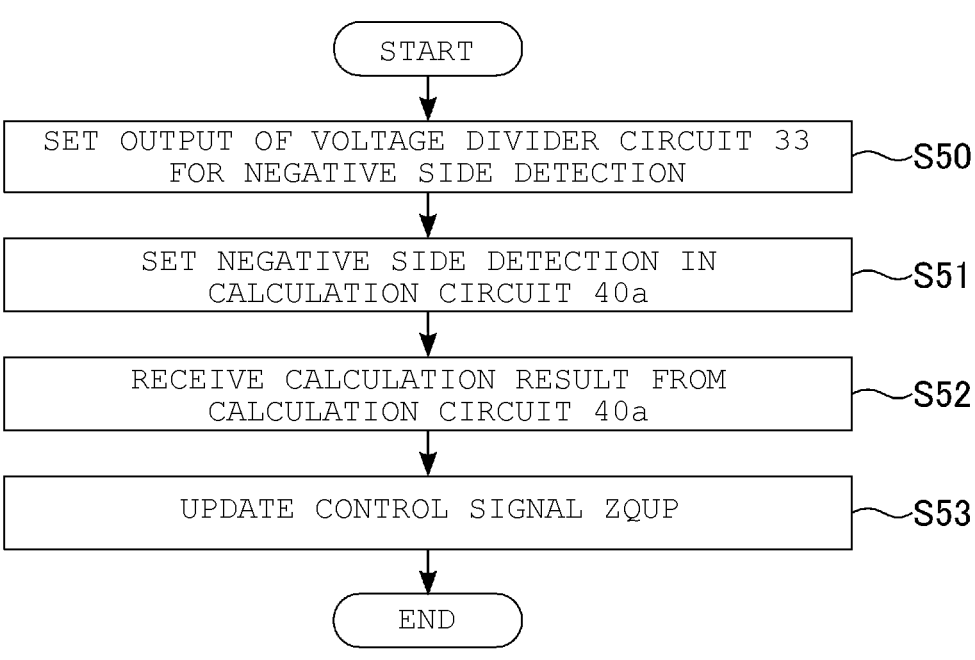
FIG. 22 is a flowchart illustrating an example of a negative side detection operation performed by the semiconductor device.

The negative side detection operation of the voltage VN1 will be described. FIG. 22 is a flowchart illustrating an example of the negative side detection operation of the voltage VN1 of the semiconductor device according to the second embodiment. When the negative side detection operation of the voltage VN1 starts (START), the sequencer 13 sets an output of the voltage divider circuit 33 for negative side detection (S50). Specifically, the sequencer 13 controls the selector 331 of the voltage divider circuit 33 such that a fifth reference voltage Vref5 is output to the selector 37 and a sixth reference voltage Vref6 is output to the selector 35. The fifth reference voltage Vref5 is a voltage lower by the voltage ΔVr than the target voltage Vtgt. The sixth reference voltage Vref6 is a voltage lower by the voltage ΔVs than the target voltage Vtgt. The sequencer 13 sets the calculation circuit 40*a* for negative side detection (S51).

The sequencer 13 receives a calculation result from the calculation circuit 40*a* (S52).

Then, the sequencer 13 updates the control signal ZQUP based on the calculation result (S53). Specifically, the control signal ZQUP is changed to be shifted in the direction of the target voltage Vtgt by the voltage ΔV1, ΔV2, or (ΔV1)/2. The voltage (ΔV1)/2 is an example, and a voltage less than the ΔV1 may be used. Through the process, the output impedances of the pull-up circuit 30 and the replica pull-up circuit 31 are updated to latest values.

Then, the negative side detection operation ends (END).

Figure 23:
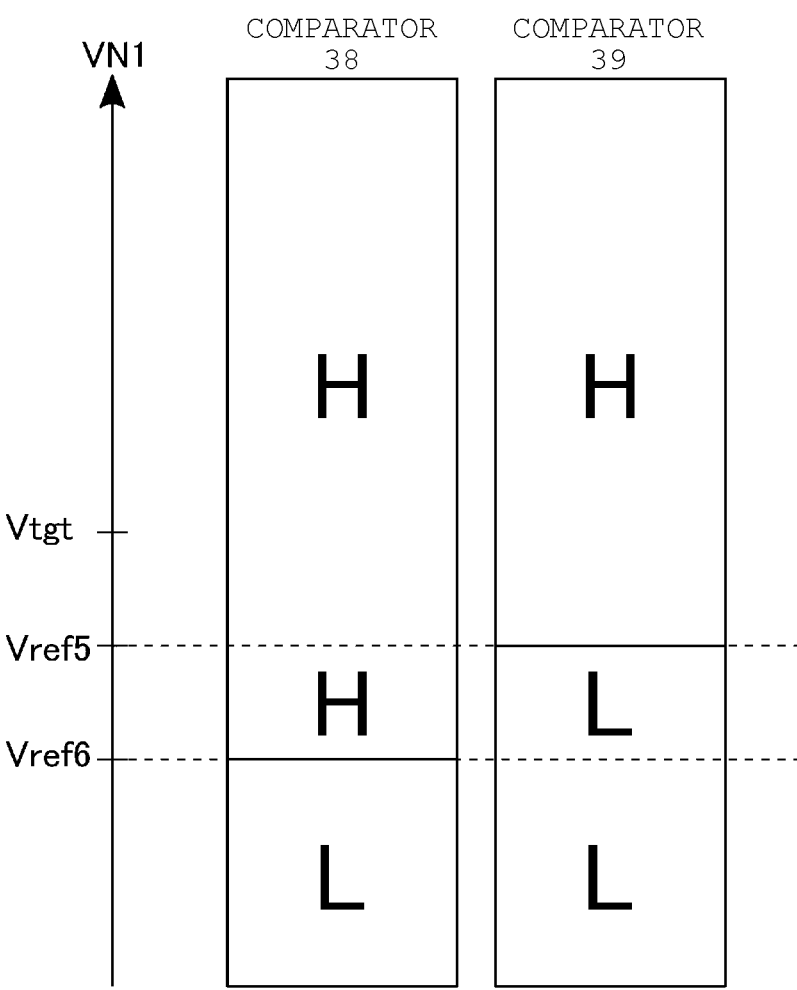
FIG. 23 is a flowchart illustrating an example of an operation in the negative side detection operation performed by the calculation circuit of the semiconductor device.

The details of calculation of the calculation circuit 40*a* in the negative side detection operation will be described. FIG. 23 is a diagram illustrating an example of an operation in the negative side detection operation performed by the calculation circuit of the semiconductor device according to the second embodiment. The vertical axis represents a value of the voltage VN1. A box written with H or L indicates that the comparators 38 and 39 output an "H" level or an "L" level. When the voltage VN1 is lower than the sixth reference voltage Vref6, the comparator 38 outputs the "L" level. When the voltage VN1 is higher than the sixth reference voltage Vref6, the comparator 38 outputs the "H" level. When the voltage VN1 is lower than the fifth reference voltage Vref5, the comparator 39 outputs the "L" level. When the voltage VN1 is higher than the fifth reference voltage Vref5, the comparator 39 outputs the "H" level. It can be understood that the value of the voltage VN1 can be partitioned into three sections by combining the outputs of the comparators 38 and 39. Specifically, the value of the voltage VN1 can be partitioned into the following three cases: a case in which the comparator 38 outputs the "H" level and the comparator 39 outputs the "H" level; a case in which the comparator 38 outputs the "H" level and the comparator 39 outputs the "L" level; and a case in which the comparator 38 outputs the "L" level and the comparator 39 outputs the "L" level. The value of the voltage VN1 can be divided into the foregoing three cases. A case in which the comparator 38 outputs the "L" level and the comparator 39 outputs the "H" level does not exist because of contradiction with the premise that the fifth reference voltage Vref5 is higher than the sixth reference voltage Vref6.

Figures 24, 25:
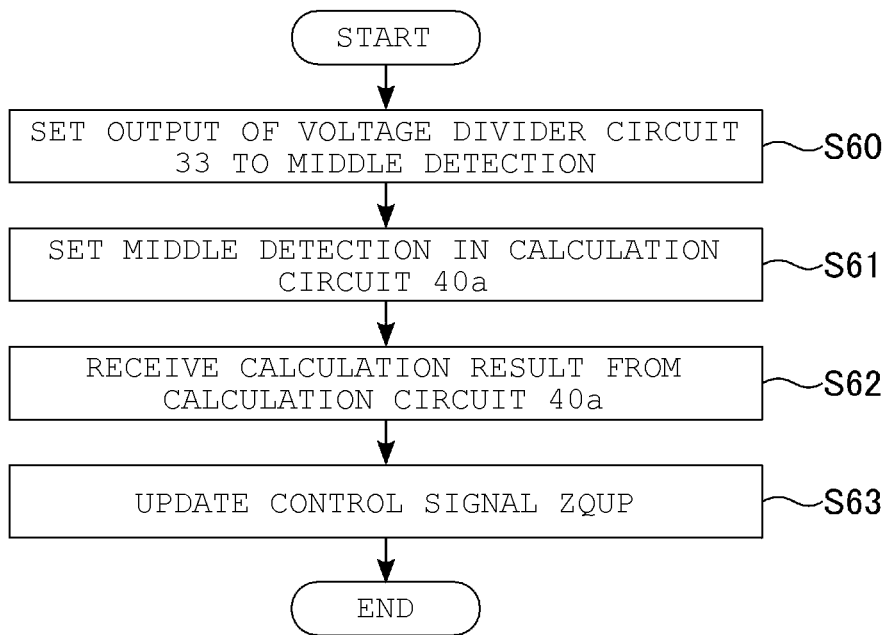
FIG. 24 is a table illustrating an example of an operation performed by the calculation circuit of the semiconductor device.
FIG. 25 is a flowchart illustrating an example of a middle detection operation performed by the semiconductor device.

FIG. 24 is a table illustrating an example of an operation performed by the calculation circuit of the semiconductor device according to the second embodiment. When the comparator 38 outputs the "H" level and the comparator 39 outputs the "H" level, the calculation circuit 40*a* determines that the voltage VN1 is appropriate or is higher than the target voltage. When the comparator 38 outputs the "H" level and the comparator 39 outputs the "L" level, the calculation circuit 40*a* determines that the voltage VN1 is slightly lower than the target voltage. When the comparator 38 outputs the "L" level and the comparator 39 outputs the "L" level, the calculation circuit 40*a* determines that the voltage VN1 is considerably lower than the target voltage. When the comparator 38 outputs the "L" level and the comparator 39 outputs the "H" level, the calculation circuit 40*a* determines that an error occurred.

The sequencer 13 updates the control signal ZQUP based on a determination result of the calculation circuit 40*a*. Specifically, when the calculation circuit 40*a* determines that the voltage VN1 is appropriate or high, the sequencer 13 updates the control signal ZQUP so that the voltage VN1 is lowered by the voltage (ΔV1)/2. When the calculation circuit 40*a* determines that the voltage VN1 is slightly low, the sequencer 13 updates the control signal ZQUP so that the voltage VN1 is raised by the voltage ΔV1. When the calculation circuit 40*a* determines that the voltage VN1 is considerably low, the sequencer 13 updates the control signal ZQUP so that the voltage VN1 is raised by the voltage ΔV2. When the calculation circuit 40*a* determines an error, the sequencer 13 maintains the control signal ZQUP.

The details of an update of the control signal ZQUP based on a determination result of the calculation circuit 40*a* will be described. When the calculation circuit 40*a* determines that the voltage VN1 is appropriate or high, the voltage VN1 is determined to be appropriate or high although a determination condition is set on the assumption that the voltage VN1 is lowered. That is, it can be estimated that the voltage VN1 is slightly higher than the target voltage Vtgt. Therefore, to calibrate a very slight error, the sequencer 13 updates the control signal ZQUP so that the voltage VN1 is lowered by the voltage (ΔV1)/2. When the calculation circuit 40*a* determines that the voltage VN1 is slightly low, it is expected that the voltage VN1 is slightly distant from the target voltage Vtgt. Therefore, to calibrate a slight error, the sequencer 13 updates the control signal ZQUP so that the voltage VN1 is raised by the voltage ΔV1. When the calculation circuit 40*a* determines that the voltage VN1 is considerably low, it is expected that the voltage VN1 is considerably distant from the target voltage Vtgt. Therefore, to calibrate a considerably distant error, the sequencer 13 updates the control signal ZQUP so that the voltage VN1 is raised by the voltage ΔV2 higher than the voltage ΔV1.

The middle detection operation of the voltage VN1 will be described. FIG. 25 is a flowchart illustrating an example of the middle detection operation of the voltage VN1 of the semiconductor device according to the second embodiment. When the middle detection operation of the voltage VN1 starts (START), the sequencer 13 sets an output of the voltage divider circuit 33 for middle detection (S60). Specifically, the sequencer 13 controls the selector 331 of the voltage divider circuit 33 such that the first reference voltage Vref1 is output to the selector 35 and the second reference voltage Vref2 is output to the selector 37.

The sequencer 13 sets the calculation circuit 40a for middle detection (S61).

The sequencer 13 receives a calculation result from the calculation circuit 40a (S62).

Then, the sequencer 13 maintains or updates the control signal ZQUP based on the calculation result (S63). Specifically, the control signal ZQUP is maintained or the control signal ZQUP is changed to be shifted in the direction of the target voltage Vtgt by the voltage ΔV1. Through the process, the output impedances of the pull-up circuit 30 and the replica pull-up circuit 31 are updated to latest values.

Then, the middle detection operation ends (END).

An operation performed by the calculation circuit 40a in the middle detection operation is similar to the operation performed by the calculation circuit 40a according to the first embodiment.

The sequencer 13 maintains or updates the control signal ZQUP based on a determination result of the calculation circuit 40a. The operation is similar to the operation performed by the semiconductor device 1 according to the first embodiment.

The positive side detection operation of the voltage VN1 (S23), the negative side detection operation of the voltage VN1 (S25), and the middle detection operation of the voltage VN1 (S26) in FIG. 17 was described above with reference to FIGS. 17 to 25. The positive side detection operation of the voltage VN2 (S29), the negative side detection operation of the voltage VN2 (S31), and the middle detection operation of the voltage VN2 (S32) in FIG. 17 are similar to the case related to the voltage VN1 except that a voltage and a control signal are different.

Specifically, in the positive side detection operation of the voltage VN2, the voltage VN1 is replaced with the voltage VN2 and the control signal ZQUP is replaced with the control signal ZQDN compared to the positive side detection operation of the voltage VN1. In the negative side detection operation of the voltage VN2, the voltage VN1 is replaced with the voltage VN2 and the control signal ZQUP is replaced with the control signal ZQDN compared to the negative side detection operation of the voltage VN1. In the middle detection operation of the voltage VN2, the voltage VN1 is replaced with the voltage VN2 and the control signal ZQUP is replaced with the control signal ZQDN compared to the middle detection operation of the voltage VN1.

<2-3> Advantages

The semiconductor device 1a according to the second embodiment includes the temperature sensor 19 and the voltage sensor 20. The sequencer 13 receives temperature information and voltage information from the temperature sensor 19 and the voltage sensor 20 and determines whether there is a change in an environment in which a change in the output impedance occurs. When there is a change in the environment in which a change in the output impedance occurs, the sequencer 13 controls the voltage divider circuit 33 such that a reference voltage covering a direction in which the change is expected is output. Specifically, for example, when it is expected that the voltage VN1 is changed in the positive direction than the target voltage Vtgt, two reference voltages higher than the target voltage Vtgt are used. Accordingly, three cases in which the voltage VN1 is considerably high, slightly high, and appropriate or low are detected. The calibration is performed to reduce an error by shifting the voltage VN1 considerably, slightly, and further slightly respectively when the voltage VN1 is considerably high, the voltage VN1 is slightly high, and the voltage VN1 is appropriate or low.

As such, the semiconductor device 1a according to the second embodiment perform calibration in consideration of deviation when a change in the output impedance is expected. Accordingly, the semiconductor device 1a according to the second embodiment can reduce an error of the output impedance in the short calibration operation, and thus improve operation reliability.

The semiconductor device 1a according to the second embodiment performs an operation similar to that of the first embodiment when the change in the output impedance is expected to be neither positive nor negative. Accordingly, the semiconductor device 1a according to the second embodiment can reduce an error of the output impedance by the short calibration operation, and thus improve operation reliability as in the semiconductor device 1 according to the first embodiment.

<3> Third Embodiment

A configuration of a semiconductor device 1b according to a third embodiment differs from the semiconductor device 1 according to the first embodiment in a configuration of a comparator and a short calibration operation. Hereinafter, differences of the semiconductor device 1b according to the third embodiment from the first embodiment will be described.

<3-1> Configuration

<3-1-1> Configuration of ZQ Calibration Circuit 18b

Figure 26:
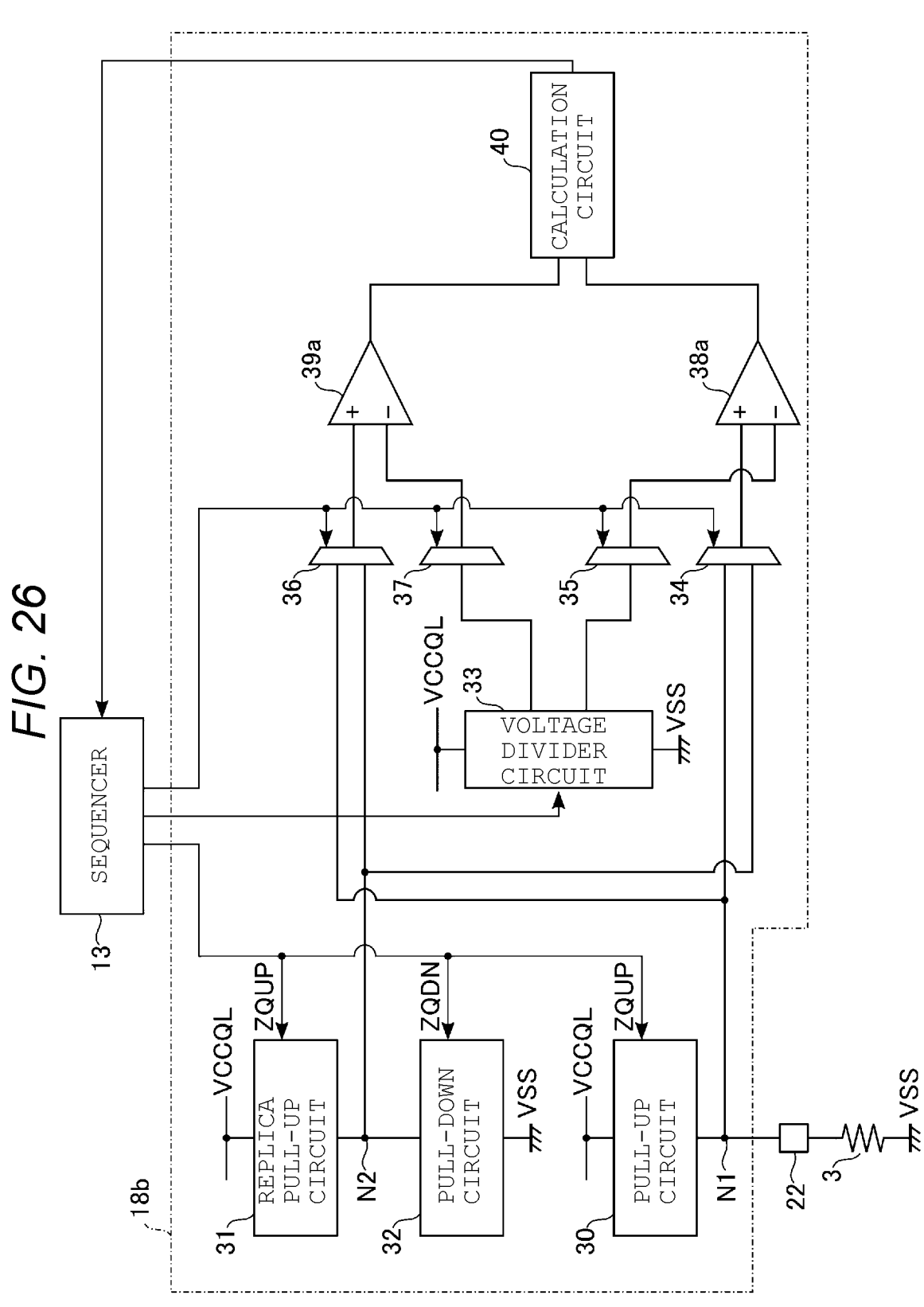
FIG. 26 is a block diagram illustrating a configuration example of a ZQ calibration circuit, a resistance element, and a sequencer of a semiconductor device according to a third embodiment.

FIG. 26 is a block diagram illustrating a configuration example of a ZQ calibration circuit, a resistance element, and a sequencer of a semiconductor device according to the third embodiment. A configuration of a ZQ calibration circuit 18b according to the third embodiment differs from the configuration of the ZQ calibration circuit 18 according to the first embodiment in a configuration of a comparator.

A comparator 38a according to the third embodiment has a negative input offset voltage with respect to the comparator 38 according to the first embodiment. Specifically, the comparator 38a has an input offset voltage of −ΔVr.

A comparator 39a according to the third embodiment has a positive input offset voltage with respect to the comparator 39 according to the first embodiment. Specifically, the comparator 39a has an input offset voltage of +ΔVr.

Figure 27:
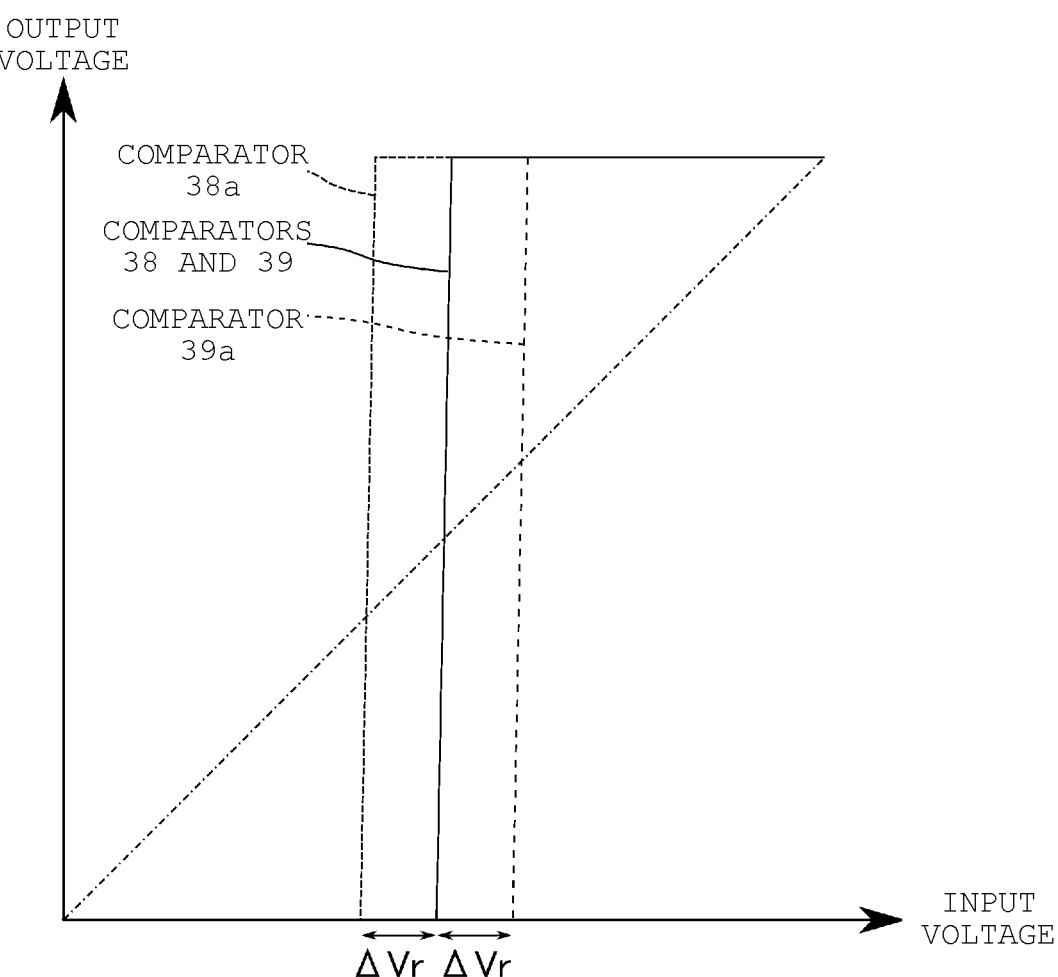
FIG. 27 is a graph illustrating an example of input/output characteristics of a comparator in the semiconductor device.

FIG. 27 is a graph illustrating an example of input/output characteristics of a comparator in the semiconductor device according to the third embodiment. The horizontal axis represents an input voltage and the vertical axis represents an output voltage. When a reference voltage is supplied to an inversion input terminal of the comparator and a non-inversion input terminal is swept from a low voltage to a high voltage, input/output characteristics can be obtained. A one-dot chain line indicates input/output characteristics when the input and the output are equal. A solid line indicates input/output characteristics of the comparators 38 and 39 according to the first embodiment. A dense broken line indicates input/output characteristics of the comparator 38a according to the third embodiment. A rough broken line indicates input/output characteristics of the comparator 39a according to the third embodiment.

In the comparators 38, 38a, and 39a, a difference occurs in an input voltage of which an output level is inverted. The comparator 38a inverts an output level at an input voltage lower by the voltage ΔVr than the comparator 38. The comparator 39a inverts an output level at an input voltage higher by the voltage ΔVr than the comparator 39. Such difference occurs by an input offset voltage. As such, the input offset voltage shifts the input voltage inverted by the output level.

The other configuration of the ZQ calibration circuit 18b is similar to the configuration of the ZQ calibration circuit 18 according to the first embodiment.

<3-2> Operation

Figure 28:
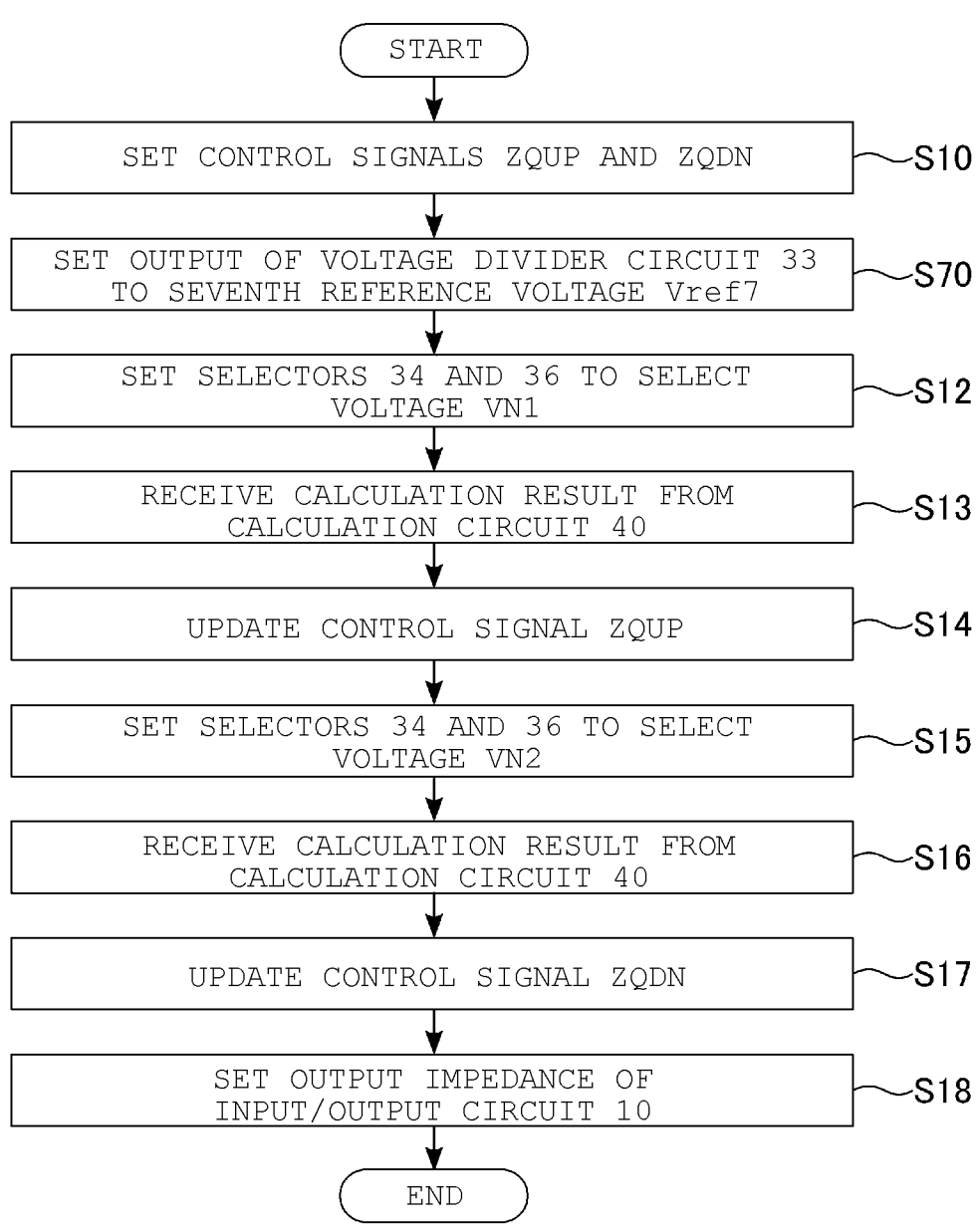
FIG. 28 is a flowchart illustrating an example of a short calibration operation performed by the semiconductor device.

FIG. 28 is a flowchart illustrating an example of a short calibration operation performed by the semiconductor device according to the third embodiment. A short calibration operation performed by the semiconductor device 1b according to the third embodiment differs from the short calibration operation performed by the semiconductor device 1 according to the first embodiment in that step S11 is replaced with step S70.

In step S70, the sequencer 13 sets an output of the voltage divider circuit 33 to a seventh reference voltage Vref7 (S70). Specifically, the sequencer 13 controls the selector 331 of the voltage divider circuit 33 such that the seventh reference voltage Vref7 is output to the selectors 35 and 37. The seventh reference voltage Vref7 is equal to the target voltage Vtgt.

The other operations are similar to those of the semiconductor device 1 according to the first embodiment.

<3-3> Advantages

The semiconductor device 1b according to the third embodiment includes the comparator 38a that has a negative input offset and the comparator 39a that has a positive input offset. The comparator 38a compares the seventh reference voltage Vref7 with the voltage VN1 and the comparator 39a compares the seventh reference voltage Vref7 with the voltage VN1. The calculation circuit 40 calculates whether the voltage VN1 is high, appropriate, or low based on an output of the comparator 38a and an output of the comparator 39a. The sequencer 13 updates the control signal ZQUP based on a calculation result.

As such, in the semiconductor device 1b according to the third embodiment, the comparator 38a has the negative input offset and the comparator 39a has the positive input offset. Thus, even when the comparators 38a and 39a commonly use the seventh reference voltage Vref7, an operation similar to that of the first embodiment can be executed. Accordingly, the semiconductor device 1b according to the third embodiment can reduce an error of the output impedance by the short calibration operation, and thus improve operation reliability as in the first embodiment.

<4> Modified Examples and the Like

In the foregoing embodiments, the cases in which the voltage sensor 20 is provided in the semiconductor device 1 have been described as examples. The voltage sensor 20 may be provided in, for example, a device other than the semiconductor device 1. For example, a power management IC supplying power to the semiconductor device 1 may include the voltage sensor. Volage information read by the voltage sensor of the power management IC may be transmitted from the power management IC to the semiconductor device 1 and the voltage information may be used in the semiconductor device 1.

Figure 29:
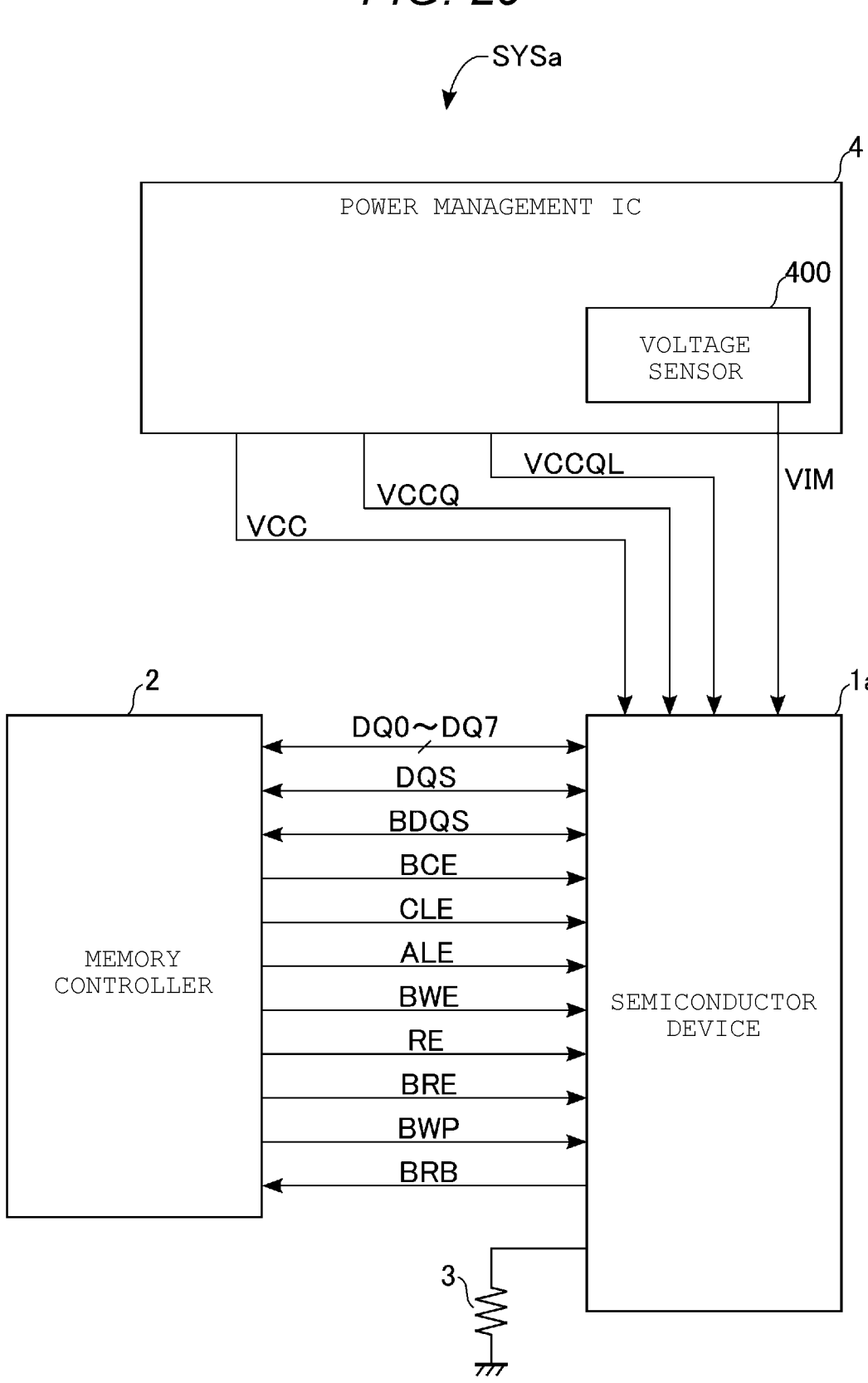
FIG. 29 is a block diagram illustrating an example of a configuration of a memory system including a semiconductor device according to a modified example.

FIG. 29 is a block diagram illustrating an example of a configuration of a memory system including a semiconductor device according to a modified example. A memory system SYSa is a storage device. The memory system SYSa executes a write operation, a read operation, and the like for data in response to a command from an external host device (not illustrated). As illustrated in FIG. 29, the memory system SYSa includes the semiconductor device 1a, the memory controller 2, the resistance element 3, and a power management IC 4.

The power management IC 4 is an IC chip. The power management IC 4 includes a voltage sensor 400. The voltage sensor 400 reads a voltage value of a voltage supplied by the power management IC 4 and generates voltage information VIM. The voltage information VIM includes information regarding voltage values of the voltages VCC, VCCQ, and VCCQL. The power management IC 4 supplies the voltages VCC, VCCQ, and VCCQL to the semiconductor device 1a and transmits the voltage information VIM to the semiconductor device 1a.

The semiconductor device 1a is a nonvolatile memory. The semiconductor device 1a is, for example, a NAND flash memory. The semiconductor device 1a operates using the voltages VCC, VCCQ, and VCCQL. The semiconductor device 1a executes various operations to take measures against a change in voltage based on the received voltage information VIM.

The other configuration of the memory system SYSa is similar to the memory system SYS described in the first embodiment.

As such, similar advantages to those of the foregoing embodiments can be obtained even when a voltage sensor provided outside of the semiconductor device 1a, for example, the voltage sensor 400 provided in the power management IC 4, transmits the voltage information VIM.

In the foregoing embodiments, the cases in which the pull-up circuit 30, the replica pull-up circuit 31, and the pull-down circuit 32 include the transistors 303, 313, and 322 receiving the control signal CTRL, respectively, have been described as examples. The transistors 303, 313, and 322 receiving the control signal CTRL may be omitted. When the transistors 303, 313, and 322 are omitted, current routes of the omitted transistors may be replaced with wirings so that the current routes are short-circuited. Specifically, in the pull-up circuit 30, the transistor 303 may be omitted, the voltage VCCQL may be supplied to the source of each of the transistors 301<4:0>, and the voltage VCCQL may be applied to the drain of each of the transistors 302<4:0>. In the replica pull-up circuit 31, the transistor 313 may be omitted, the voltage VCCQL may be applied to the source of each of the transistors 311<4:0>, and the voltage VCCQL may be applied to the drain of each of the transistors 312<4:0>. In the pull-down circuit 32, the transistor 322 may be omitted and the source of each of the transistors 321 <4:0> may be grounded.

In the foregoing embodiments, the cases in which each of the pull-up circuit 30, the replica pull-up circuit 31, and the pull-down circuit 32 includes a set including five transistors have been described as examples. The number of transistors in each of the pull-up circuit 30, the replica pull-up circuit 31, and the pull-down circuit 32 is not limited to five, as exemplified, and any number of transistors may be mounted.

In the second embodiment, the case in which after it is determined that there is a change in the environment in which the voltage VN1 is raised (S22), it is determined whether there is a change in the environment in which the voltage VN1 is lowered (S24) has been described as an example. After it is determined whether there is a change in the environment in which the voltage VN1 is lowered, it may be determined that there is a change in the environment in which the voltage VN1 is raised. Specifically, in the short calibration operation described with reference to FIG. 17, steps S22 and S24 may be switched and steps S23 and S25 may be switched. Similar modifications can be made for the operation related to the voltage VN2. In the short calibration operation described with reference to FIG. 17, steps S28 and S30 may be switched and steps S29 and S31 may be switched.

In the foregoing embodiments, the case in which the ZQ calibration circuit 18 includes the calculation circuit 40 and the calculation circuit 40 transmits the calculation result to the sequencer 13 has been described as an example. A set of the calculation circuit 40 and the sequencer 13 may be considered as one control circuit. The function of the calculation circuit 40 may be embedded in the sequencer 13 and an output of each of the comparators 38 and 39 may be connected to the sequencer 13.

In the foregoing embodiments, the change in the voltage VN1 according to the determination performed once by the comparators 38 and 39 has been described with reference to FIGS. 13A to 13C, 14, and 21A to 21C. The voltage of the ZQ calibration pad 22 is also changed similarly to the voltage VN1. That is, by measuring a voltage of the ZQ calibration pad 22, it is possible to observe the change in the voltage VN1.

Figure 30:
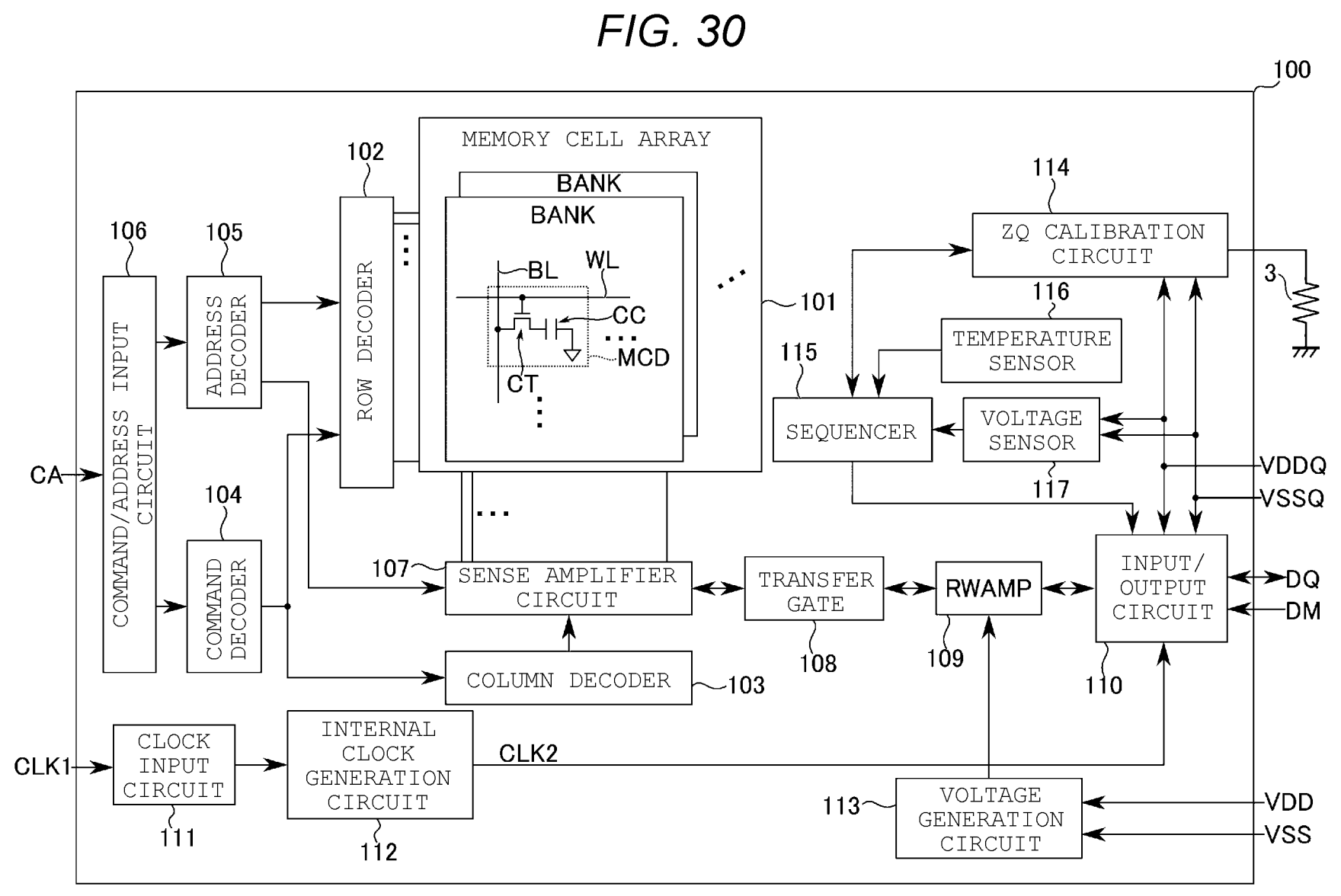

In the foregoing embodiments, the NAND flash memory has been described as an example of the semiconductor device. For example, the semiconductor device may be a DRAM. FIG. 30 is a block diagram illustrating an example of a configuration of a semiconductor device according to a modified example. As illustrated in FIG. 30, a DRAM 100 includes a memory cell array 101, a row decoder 102, a column decoder 103, a command decoder 104, an address decoder 105, a command/address input circuit 106, a sense amplifier circuit 107, a transfer gate 108, a read/write amplifier circuit (RWAMP) 109, an input/output circuit 110, a clock input circuit 111, an internal clock generation circuit 112, a voltage generation circuit 113, a ZQ calibration circuit 114, a sequencer 115, a temperature sensor 116, and a voltage sensor 117.

The memory cell array 101 includes a plurality of memory cells MCD. Each memory cell MCD of the DRAM 100 includes a cell capacitor CC and a cell transistor CT. A gate of the cell transistor CT is connected to one corresponding word line WL among the plurality of word lines WL. One end of a current route of the cell transistor CT is connected to the bit line BL. The other end of the current route of the cell transistor CT is connected to one end of the cell capacitor CC. The other end of the cell capacitor CC is grounded. The cell capacitor CC can store an amount of charge according to data to be stored. The cell transistor CT switches conduction and non-conduction (selection and non-selection of the memory cell) between the memory cell MCD and the bit line BL. The plurality of memory cells MCD are arranged in a 2-dimensional array form or a 3-dimensional array form in the memory cell array 101.

For example, the memory cell array 101 includes a plurality of banks. The banks are units of control including the plurality of memory cells. The plurality of banks can operate independently.

The row decoder 102 controls selection and non-selection of rows (for example, word lines) of the memory cell array 101 based on a decoding result of address information and a decoding result of a command.

The column decoder 103 controls selection and non-selection of columns (for example, bit lines) of the memory cell array 101 based on a decoding result of address information and a decoding result of a command.

The command decoder 104 decodes a command from the command/address input circuit 106. The command decoder 104 transmits a decoding result of the command to the row decoder 102 and the column decoder 103.

The address decoder 105 decodes address information from the command/address input circuit 106. The address decoder 105 transmits a decoding result of the address information to the row decoder 102 and the column decoder 103.

The command/address input circuit 106 receives a command/address signal CA supplied from the outside. The command/address signal CA includes command and address information. The command/address input circuit 106 transmits a command to the command decoder 104. The command/address input circuit 106 transmits address information to the address decoder 105.

The sense amplifier circuit 107 senses and amplifies a signal from the memory cell MCD in a read sequence. The sense amplifier circuit 107 transmits a signal from the memory cell MCD as read data to the input/output circuit 110 via the transfer gate 108 and the read/write amplifier circuit 109. The sense amplifier circuit 107 receives write data from the input/output circuit 110 via the transfer gate 108 and the read/write amplifier circuit 109. The sense amplifier circuit 107 outputs a signal according to the write data to the bit line BL.

The transfer gate 108 controls data transfer between the sense amplifier circuit 107 and the read/write amplifier circuit 109.

The read/write amplifier circuit 109 amplifies a level of a signal (signal value) according to the read data and a level of a signal according to the write data.

The input/output circuit 110 functions as an interface circuit of data DQ transmitted between the memory cell array 101 and the outside of the DRAM 100. The input/output circuit 110 operates using power voltages VDDQ and VSSQ from the outside. The input/output circuit 110 transmits write data to the memory cell array 101 at a timing synchronized with an internal clock CLK2. The input/output circuit 110 transmits read data to an external device of the DRAM 100 at a timing synchronized with the internal clock CLK2. For example, the input/output circuit 110 receives a data mask signal DM. Accordingly, the input/output circuit 110 executes mask processing on the data DQ.

The clock input circuit 111 receives a clock CLK1 from the outside (hereinafter referred to as an external clock). The clock input circuit 111 transmits the external clock CLK1 to the internal clock generation circuit 112.

The internal clock generation circuit 112 generates the internal clock CLK2 based on the external clock CLK1. The internal clock generation circuit 112 transmits the generated internal clock CLK2 to the input/output circuit 110 or the like.

The voltage generation circuit 113 generates a plurality of voltages respectively used for operation sequences of various operations of the DRAM 100 using power voltages VDD and VSS from the outside. The voltage generation circuit 113 transmits the generated voltages to another circuit (for example, the read/write amplifier circuit 109).

The ZQ calibration circuit 114 is connected to the external resistance element 3. The ZQ calibration circuit 114 operates using the power voltages VDDQ and the VSSQ from the outside. The ZQ calibration circuit 114 executes a ZQ calibration operation of calibrating an output impedance of the input/output circuit 110 based on a resistant value of the resistance element 3.

The sequencer 115 causes the ZQ calibration circuit 114 to execute the ZQ calibration operation. The sequencer 115 sets the output impedance of the input/output circuit 110.

The temperature sensor 116 measures a temperature of the DRAM 100. The temperature sensor 116 transmits information regarding the measured temperature to the sequencer 115.

The voltage sensor 117 measures the power voltages VDDQ and VSSQ. The voltage sensor 117 transmits the information regarding the measured voltages to the sequencer 115.

The ZQ calibration circuit 114 according to the modified example has a configuration similar to that of the ZQ calibration circuit 18 according to the first embodiment. That is, the ZQ calibration circuit 114 includes two comparators to execute the ZQ calibration operation based on outputs of the two comparators. Accordingly, the DRAM 100 according to the modified example can obtain the same advantages as those of the semiconductor device 1 according to the first embodiment.

The DRAM 100 according to the modified example includes the temperature sensor 116 and the voltage sensor 117. That is, the sequencer 115 can detect a change in an environment. Accordingly, the DRAM 100 according to the modified example can obtain the same advantages as those of the semiconductor device 1a according to the second embodiment.

In the modified example, the case in which the semiconductor device is a DRAM has been exemplified, but the semiconductor device may be a random access memory other than the DRAM. For example, the semiconductor device may be a static RAM (SRAM). The semiconductor device may be a memory device using a transition metal oxide element that has variable resistance characteristics as a memory element (for example, a variable resistance memory such as a resistive random access memory (ReRAM)), a memory device using a phase-change element as a memory element (for example, a phase-change memory such as a phase change random access memory (PCRAM)), or a memory device using a ferroelectric element as a memory element (for example, a ferroelectric memory such as a ferroelectric random access memory (FeRAM)).

In the present specification, "one end of the current route of the transistor" corresponds to a source or a drain of the transistor.

In the present specification, "connection" refers electric connection. For example, connection via another element is not excluded. The "electric connection" may be connection via an insulator as long as an operation is executed like those connected electrically to each other.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first circuit configured to pull up a voltage of a first node, the first circuit including a plurality of first transistors connected in parallel to the first node;
a first pad connected to the first node;
a first comparator configured to compare a voltage of the first node with a first reference voltage;

a second comparator configured to compare the voltage of the first node with a second reference voltage;
a control circuit configured to control the plurality of first transistors based on an output of the first comparator and an output of the second comparator; and
a voltage divider circuit configured to output one of the first and second reference voltages selected based on control of the control circuit.

2. The semiconductor device according to claim 1, wherein the voltage divider circuit includes:
a plurality of resistors connected in series; and
a selector to which a plurality of voltages divided by the plurality of resistors are input.

3. The semiconductor device according to claim 1, wherein the voltage divider circuit is connected to each of a power voltage and a ground voltage.

4. The semiconductor device according to claim 1, further comprising:
a temperature sensor, wherein
the control circuit causes the voltage divider circuit to vary values of the first and second reference voltages based on a change in a temperature acquired from the temperature sensor.

5. The semiconductor device according to claim 1, further comprising:
a voltage sensor configured to measure a power voltage supplied to the semiconductor device, wherein
the control circuit causes the voltage divider circuit to vary values of the first and second reference voltages based on a change in a voltage acquired from the voltage sensor.

6. The semiconductor device according to claim 1, further comprising:
a second circuit configured to pull up a voltage of a second node, the second circuit including a plurality of second transistors connected in parallel to the second node; and
a third circuit configured to pull down the voltage of a second node, the third circuit including a plurality of third transistors connected in parallel to the second node,
wherein the control circuit configured to control the plurality of second transistors and the plurality of third transistors based on outputs of the first comparator and outputs of the second comparator.

7. A semiconductor system comprising:
a power device configured to supply a power voltage to the semiconductor device and transmit information regarding a value of the power voltage to the semiconductor device; and
the semiconductor device according to claim 1 configured to cause the voltage divider circuit to vary values of the first and second reference voltages based on a change in the information.

8. The semiconductor device according to claim 1, wherein the first reference voltage is different from the second reference voltage.

9. The semiconductor device according to claim 1, wherein
the first comparator has a negative input offset,
the second comparator has a positive input offset, and
the first reference voltage is substantially equal to the second reference voltage.

10. The semiconductor device according to claim 1, wherein
the first reference voltage is lower than ½ of a power voltage of the first circuit, and the second reference voltage is higher than ½ of the power voltage of the first circuit.

11. The semiconductor device according to claim 1, wherein the first reference voltage is lower than ⅓ of a power voltage of the first circuit, and the second reference voltage is higher than ⅓ of the power voltage of the first circuit.

12. The semiconductor device according to claim 1, further comprising:

a NAND flash memory array; and an input/output circuit configured to receive data to be written into and output data read from the NAND flash memory array, wherein the control circuit is configured to calibrate an output impedance of the input/output circuit by controlling the plurality of first transistors.

13. The semiconductor device according to claim 1, further comprising:

a DRAM memory cell array; and an input/output circuit configured to receive data to be written into and output data read from the DRAM memory cell array, wherein the control circuit is configured to calibrate an output impedance of the input/output circuit by controlling the plurality of first transistors.

14. A method of controlling a semiconductor device including:

a first circuit connected to a first node and configured to pull up a voltage of the first node; and a first pad connected to the first node and to a resistance element provided outside the semiconductor device, the method comprising:

performing a first calibration of output impedance of the semiconductor device for a first period of time; and performing a second calibration of the output impedance of the semiconductor device for a second period of time longer than the first period of time, wherein the first calibration comprises:

comparing a voltage of the first node with each of a first reference voltage and a second reference voltage; and controlling the first circuit to vary the voltage of the first node, based on a relation between the voltage of the first node and the first reference voltage and a relation between the voltage of the first node and the second reference voltage.

15. The method of controlling the semiconductor device according to claim 14, wherein the number of times the voltage of the first node is compared with the first reference voltage during the first calibration is once and the number of times the voltage of the first node is compared with the second reference voltage during the first calibration is once.

16. The method of controlling the semiconductor device according to claim 14, wherein the first reference voltage is lower than the second reference voltage, and said controlling the first circuit to vary the voltage of the first node comprises:

maintaining the voltage of the first node when the voltage of the first node is higher than the first reference voltage and is lower than the second reference voltage, raising the voltage of the first node when the voltage of the first node is lower than the first reference voltage and is lower than the second reference voltage, and lowering the voltage of the first node when the voltage of the first node is higher than the first reference voltage and is higher than the second reference voltage.

17. The method of controlling the semiconductor device according to claim 14, wherein the first reference voltage is lower than the second reference voltage, and said controlling the first circuit to vary the voltage of the first node comprises:

lowering the voltage of the first node by a predetermined voltage when the voltage of the first node is higher than the first reference voltage and is lower than the second reference voltage, lowering the voltage of the first node by a voltage greater than the predetermined voltage when the voltage of the first node is higher than the first reference voltage and is higher than the second reference voltage, and raising the voltage of the first node by a voltage less than the predetermined voltage when the voltage of the first node is lower than the first reference voltage and is lower than the second reference voltage.

18. The method of controlling the semiconductor device according to claim 14, wherein the first reference voltage is lower than the second reference voltage, and said controlling the first circuit to vary the voltage of the first node comprises:

maintaining the voltage of the first node when the voltage of the first node is lower than the first reference voltage and is higher than the second reference voltage.

19. The semiconductor device according to claim 1, wherein the first reference voltage is lower than the second reference voltage, and the control circuit is configured to determine that an error occurred when the voltage of the first node is lower than the first reference voltage and is higher than the second reference voltage.

* * * * *